United States Patent
Murase

(10) Patent No.: US 12,339,922 B2
(45) Date of Patent: Jun. 24, 2025

(54) NON-LINEAR CHARACTERISTIC CALCULATING METHOD, NON-LINEAR CHARACTERISTIC CALCULATING PROGRAM, METHOD FOR USING SAME, AND RECORDING MEDIUM

(71) Applicant: Murata Manufacturing Co., Ltd., Kyoto-fu (JP)

(72) Inventor: Motonori Murase, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 503 days.

(21) Appl. No.: 17/028,900

(22) Filed: Sep. 22, 2020

(65) Prior Publication Data

US 2021/0097128 A1    Apr. 1, 2021

(30) Foreign Application Priority Data

Sep. 30, 2019 (JP) .................. 2019-179959

(51) Int. Cl.
*G06F 17/13* (2006.01)
*G06F 17/16* (2006.01)

(52) U.S. Cl.
CPC .............. *G06F 17/13* (2013.01); *G06F 17/16* (2013.01)

(58) Field of Classification Search
CPC ........ G06F 17/13; G06F 17/16; G06F 30/373; G06F 30/367; G06F 30/36; G06F 30/23
See application file for complete search history.

(56) References Cited

U.S. PATENT DOCUMENTS

| | | | | |
|---|---|---|---|---|
| 7,890,198 | B1* | 2/2011 | Gahinet | G06F 30/00 700/83 |
| 7,962,317 | B1* | 6/2011 | Kanapka | G06F 30/20 703/2 |
| 2011/0054863 | A1* | 3/2011 | Larimore | G06F 17/18 703/2 |
| 2018/0143257 | A1* | 5/2018 | Garcia | G01R 31/382 |

FOREIGN PATENT DOCUMENTS

JP    H07-114531 A    5/1995

OTHER PUBLICATIONS

Goose, J. "Modeling and identification of Linear Parameter-Varying systems" (Year: 2016).*
Mercere et al. "Parameterization and identification of multivariable state-space systems: A canonical approach" (Year: 2011).*
"State". Merriam-webster [dictionary] Retrieved from <<https://www.merriam-webster.com/dictionary/state?utm_campaign=sd&utm_medium=serp&utm_source=jsonld>> (Year: 2023).*

(Continued)

*Primary Examiner* — Emerson C Puente
*Assistant Examiner* — Alfred H B Wechselberger
(74) *Attorney, Agent, or Firm* — Studebaker Brackett PLLC

(57) ABSTRACT

In this non-linear characteristic calculating method, a non-linear characteristic of a non-linear device is calculated using a non-linear model consisting of non-linear equations obtained by changing constant coefficients of a linear state space representation that are also coefficients of a transfer function into functions of one state variable.

18 Claims, 23 Drawing Sheets

(56) References Cited

OTHER PUBLICATIONS

Gabano et al. "LPV continuous fractional modeling applied to ultracapacitor impedance identification" Control Engineering Practice, vol. 45 (2015), pp. 86-97 [retrieved on May 9, 2024] (Year: 2015).*

Mehrotra et al. "On State Space Modeling and Order Reduction of Chua's Nonlinear Model" 2014 IEEE International Conference on Advanced Communications, Control and Computing Technologies [retrieved on Feb. 7, 2025] (Year: 2014).*

S. A. Maas et al.; "Modeling MESFETs for Intermodulation Analysis of Mixers and Amplifiers"; IEEE Transactions on Microwave Theory and Techniques; Dec. 1990; vol. 38, No. 12; pp. 1964-1971.

Bjørn Gustavsen et al.; "Rational Approximation of Frequency Domain Responses by Vector Fitting"; IEEE Transactions on Power Delivery; Jul. 1999; vol. 14, No. 3; pp. 1052-1061.

\* cited by examiner

NON-LINEAR CHARACTERISTIC CALCULATING METHOD, NON-LINEAR CHARACTERISTIC CALCULATING PROGRAM, METHOD FOR USING SAME, AND RECORDING MEDIUM

CROSS-REFERENCE TO RELATED APPLICATION

This application claims benefit of priority to Japanese Patent Application No. 2019-179959, filed Sep. 30, 2019, the entire content of which is incorporated herein by reference.

BACKGROUND

Technical Field

The present disclosure for example relates to a non-linear characteristic calculating method for calculating a non-linear characteristic of a non-linear device, a non-linear characteristic calculating program that uses the non-linear characteristic calculating method, a method for using the same, and a recording medium on which the non-linear characteristic calculating program is stored.

Background Art

Japanese Unexamined Patent Application Publication No. 7-114531 discloses a non-linear system identification method of the related art that is for estimating the non-linear elements and structure of a non-linear system such as a non-linear device. Based on expertise and experience in constructing physical models and the need for a very large amount of effort after carrying out rough classification into physical and non-physical models, this non-linear system identification method of the related art aims to estimate the non-linear elements of a non-linear system without the need for a large amount of effort.

In the non-linear system identification method, first, the output of the non-linear system is acquired, and then the output of a linear model that approximates the non-linear system is calculated. Next, the output error between the output of the non-linear system and the output of the linear model is obtained and then the non-linear elements of the non-linear system are estimated using a structure estimation method on the basis of this output error. The estimated non-linear elements are then quantified by approximating the elements using a complex Fourier series expansion and then a model of the non-linear system is constructed by using a time series model that takes into account the information on the quantified non-linear elements. As a specific example of a structure estimation method, non-linear elements are estimated from a database in which a plurality of power spectrum patterns corresponding to known non-linear elements are stored in advance.

Furthermore, a method for calculating a non-linear characteristic of an amplifier or the like using a Volterra series as a type of non-physical model is disclosed in "Modeling MESFETs for intermodulation analysis of mixers and amplifiers", S. A. Maas, IEEE Transactions on Microwave Theory and Techniques, Volume 38, 1990. In this non-linear characteristic calculating method of the related art, a non-linearity of a non-linear device such as an amplifier is expressed using a series expansion.

There is a problem with the non-linear system identification method of the related art disclosed in Japanese Unexamined Patent Application Publication No. 7-114531 in that the non-linear elements and structure of the non-linear system are estimated using a structure estimation method and thus the estimation is limited by the structure estimation method, specifically, by the range of non-linear elements and structure that are assumed in advance, and therefore there are limitations on the accuracy with which the non-linear system can be estimated. In other words, there is an issue that knowledge of and insight into the system in question are required in order to construct an effective database.

In addition, the non-linear characteristic calculating method of the related art disclosed in "Modeling MESFETs for intermodulation analysis of mixers and amplifiers", S. A. Maas, IEEE Transactions on Microwave Theory and Techniques, Volume 38, 1990 has a limitation in that application of the method is limited to the calculation of non-linear characteristics arising from weak non-linearities, which are represented by limited-order series expansions, among non-linearities possessed by non-linear devices such as amplifiers.

SUMMARY

Accordingly, the present disclosure provides a non-linear characteristic calculating method and so forth that can calculate a non-linear characteristic of a non-linear device for a wide range of non-linearities possessed by non-linear devices without estimating the non-linear elements and structures of the non-linear devices in contrast to the examples of the related art.

In a non-linear characteristic calculating method according to a preferred embodiment of the present disclosure, a non-linear characteristic of a non-linear device is calculated using a non-linear model consisting of non-linear equations obtained by changing constant coefficients in a linear state space representation that are also coefficients of a transfer function into functions of one state variable.

With this configuration, a non-linear model of a non-linear device can be constructed without estimating the non-linear elements and structure of the non-linear device and therefore without the need for knowledge of and insight into the non-linear device by using non-linear equations obtained by changing constant coefficients in a linear state space representation that are also coefficients of a transfer function into functions of one state variable, and it is possible to represent a wide range of non-linearities possessed by a non-linear device.

Therefore, in contrast to the related art, according to the non-linear characteristic calculating method and so forth of preferred embodiments of the present disclosure, it is possible to calculate a non-linear characteristic of a non-linear device for a wide range of non-linearities possessed by non-linear devices without estimating the non-linear elements and structure of the non-linear device.

Other features, elements, characteristics and advantages of the present disclosure will become more apparent from the following detailed description of preferred embodiments of the present disclosure with reference to the attached drawings.

DETAILED DESCRIPTION

Embodiment 1

Hereafter, a case in which a non-linear characteristic calculating method according to an embodiment of the present disclosure is applied to calculations performed using software employing the known simulation program with integrated circuit emphasis (SPICE) (hereinafter referred to as SPICE software) in order to predict a non-linear characteristic of a ferrite bead will be described.

Figure 1:
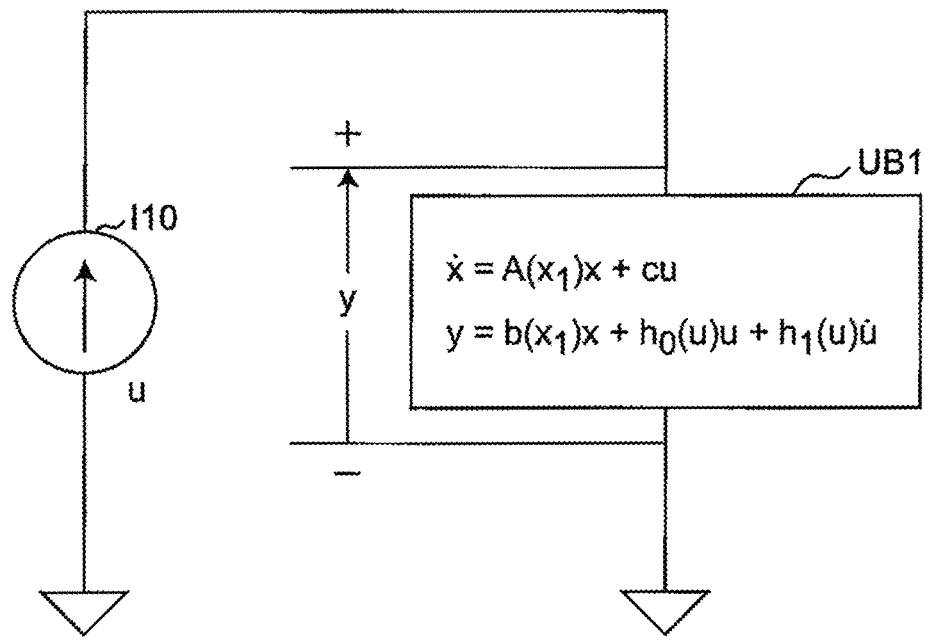
FIG. 1 is a SPICE software circuit diagram used to calculate a non-linear characteristic of a ferrite bead in embodiment 1.

FIG. 1 is a SPICE software circuit diagram used to calculate a non-linear characteristic of a ferrite bead. The term "SPICE software circuit diagram" used here refers to a circuit diagram of an electrical circuit or an electronic circuit input by a user to the SPICE software or stored in advance in the SPICE software. For example, one resistor is input in the case where a linear device is to be represented by one resistor. For a ferrite bead, which is a non-linear device, a non-linear model of the ferrite bead is input in accordance with the format of the SPICE software so that the non-linear model can be read by the SPICE software.

In FIG. 1, I10 is an arbitrary waveform current source that supplies an arbitrary current waveform u(t) of time t in order to drive a ferrite bead and UB1 is a non-linear model of the ferrite bead in this embodiment that is formed of non-linear equations obtained by changing constant coefficients of a state space representation that are also coefficients of a transfer function into functions of one state variable, as will be discussed below. In FIG. 1, the arbitrary waveform current source I10 supplies a prescribed current, such as a DC current, a current in which an alternating current is superimposed on a direct current, or a communication signal current, to the non-linear model UB1 of the ferrite bead.

Figure 2:
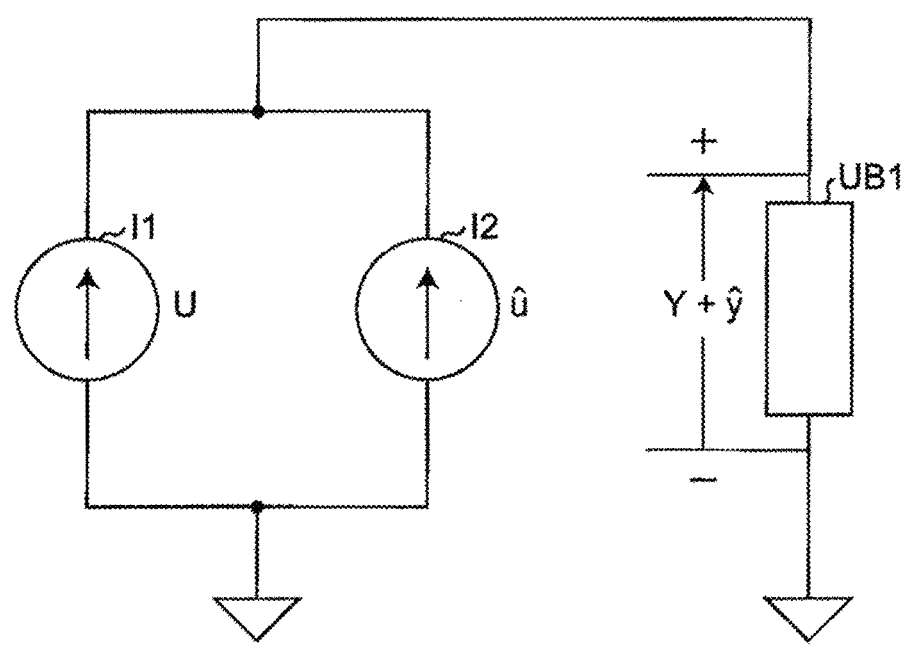
FIG. 2 is a SPICE software circuit diagram used to calculate a non-linear characteristic of the impedance of a ferrite bead in embodiment 1 and examples 1 and 3.

In addition, FIG. 2 is a circuit diagram of SPICE software used to calculate a non-linear characteristic of the impedance of a ferrite bead. In FIG. 2, I1 is a DC current source having a current value U, I2 is an AC current source having a variable frequency sine wave û as a current value, and UB1 is a non-linear model of a ferrite bead the same as in FIG. 1. In this case, the DC current source I1 and the AC current source I2 are connected in parallel with each other and supply a prescribed current to the non-linear model of a ferrite bead.

This non-linear model is represented by differential equations, and in this embodiment, the differential equations are represented by an electronic file called a "netlist" using elements and various functions provided by the SPICE software and are read by the computer when the SPICE software is running.

First, a non-linearity that appears in a ferrite bead will be described along with several concepts. In many linear devices (electrical components, electronic components, mechanical or electromechanical components, and so on), the response of an input/output ratio or the like can be expressed with sufficient accuracy by a real coefficient rational function of a complex frequency s as in formula (1-1). However, it is necessary to re-express such a function as time domain differential equations in order to calculate time variations such as a transient response of a linear device. This time domain representation is not unique, and methods such as a state space representation are known.

An example of a state space representation that provides the response of formula (1-1) is represented in formula (1-2a) and formula (1-2b). This is called a controllable canonical form. u is an input signal, y is an output signal, and $x_1$ to $x_n$ are state variables. The number of state variables is called the "order". The Laplace transformation of the ratio of the input u to the output y is equal to formula (1-1).

$$\frac{\tilde{b}_{n-1}s^{n-1} + \ldots + \tilde{b}_1 s + \tilde{b}_0}{s^n + \tilde{a}_{n-1}s^{n-1} + \ldots + \tilde{a}_1 s + \tilde{a}_0} + \tilde{h}_0 + \tilde{h}_1 s \quad (1\text{-}1)$$

$$\begin{pmatrix} \dot{x}_1 \\ \dot{x}_2 \\ \vdots \\ \dot{x}_{n-1} \\ \dot{x}_n \end{pmatrix} = \begin{pmatrix} 0 & 1 & \ldots & 0 & 0 \\ 0 & 0 & \ldots & 0 & 0 \\ \vdots & \vdots & & \vdots & \vdots \\ 0 & 0 & \ldots & 0 & 1 \\ -\tilde{a}_0 & -\tilde{a}_1 & \ldots & -\tilde{a}_{n-2} & -\tilde{a}_{n-1} \end{pmatrix} \begin{pmatrix} x_1 \\ x_2 \\ \vdots \\ x_{n-1} \\ x_n \end{pmatrix} + \begin{pmatrix} 0 \\ 0 \\ \vdots \\ 0 \\ 1 \end{pmatrix} u \quad (1\text{-}2a)$$

$$y = \begin{pmatrix} \tilde{b}_0 & \tilde{b}_1 & \ldots & \tilde{b}_{n-1} \end{pmatrix} \begin{pmatrix} x_1 \\ x_2 \\ \vdots \\ x_n \end{pmatrix} + \tilde{h}_0 u + \tilde{h}_1 \dot{u} \quad (1\text{-}2b)$$

When charge accumulates in a capacitor, various direct-current voltage values are generated between the terminals in accordance with the amount of charge. When magnetic flux accumulates in an inductor, various DC current values flow to a terminal in accordance with the amount of magnetic flux. A ferrite bead can also have a variety of DC current values and has various static and stable equilibrium points (DC operating points) that do not vary over time. When the current flowing to the ferrite bead is taken to be an input signal and the voltage produced between the terminals is taken to be an output signal, the response between the time-varying signals in the vicinity of the individual equilibrium points is linear if the magnitudes of the time-varying signals superimposed on the equilibrium values (direct current values) are sufficiently small. The response (input/output ratio of time-varying signals) expressed in the frequency domain is called a transfer function or impedance at the equilibrium points. This response may be called impedance, admittance, or S-parameter, depending on the way the input and output signals are handled, but a transfer function is a generic concept that encompasses these parameters.

Figure 3:
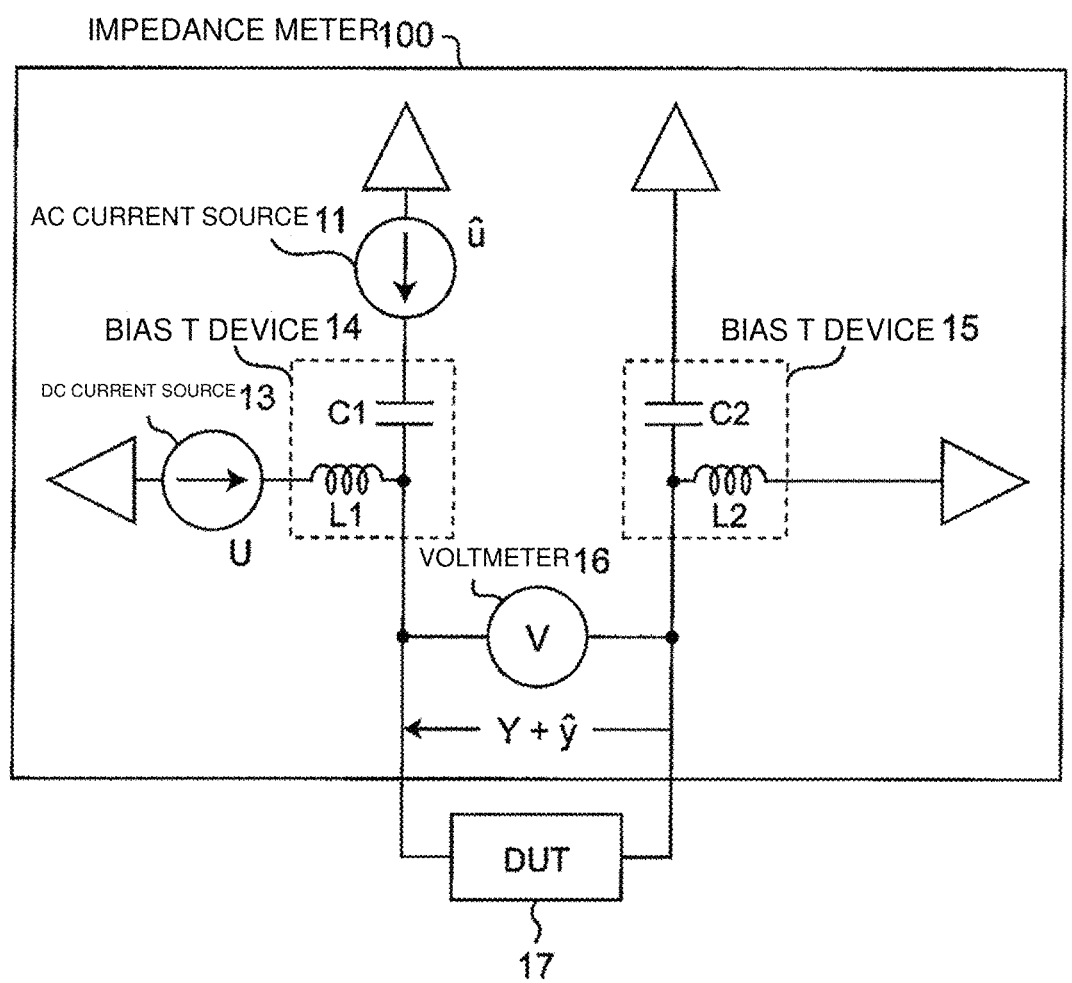
FIG. 3 is a schematic diagram of an impedance measurement system in embodiment 1 and examples 1 and 3.
Figure 4A:
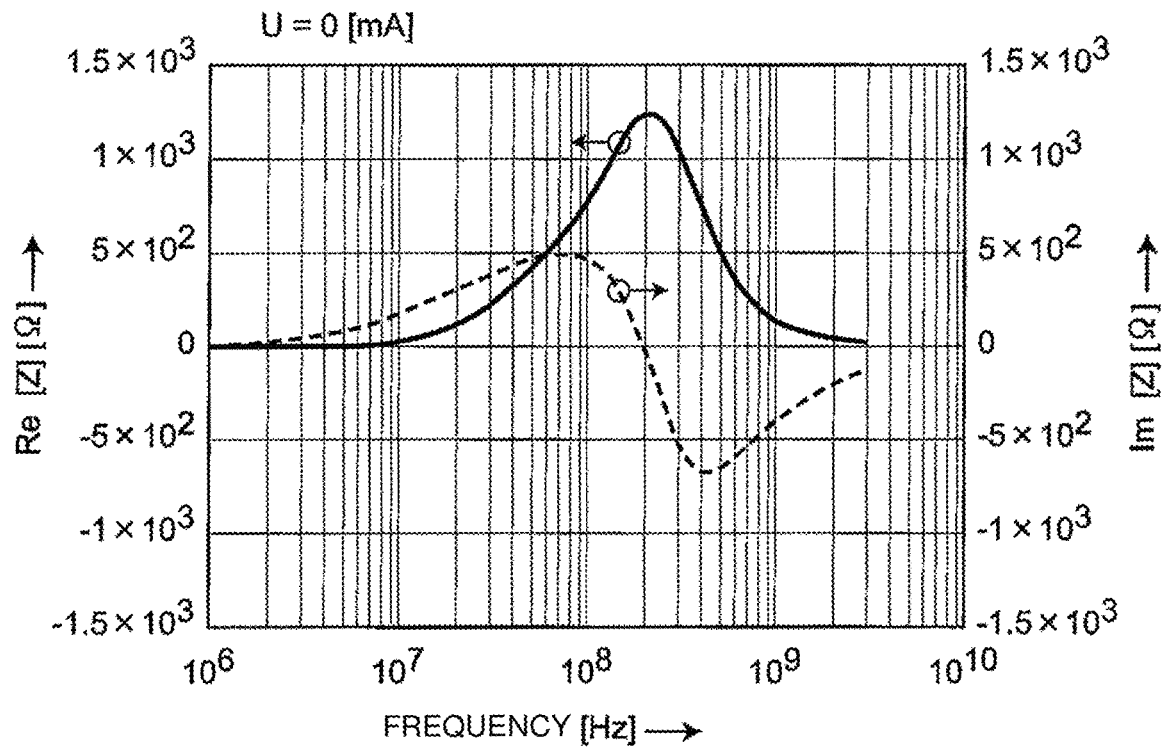
FIG. 4A is a graph illustrating impedance measurement values of a ferrite bead acquired using the impedance measurement system schematically illustrated in FIG. 3 when a DC current value U=0 mA in embodiment 1 and example 1.
Figure 4B:
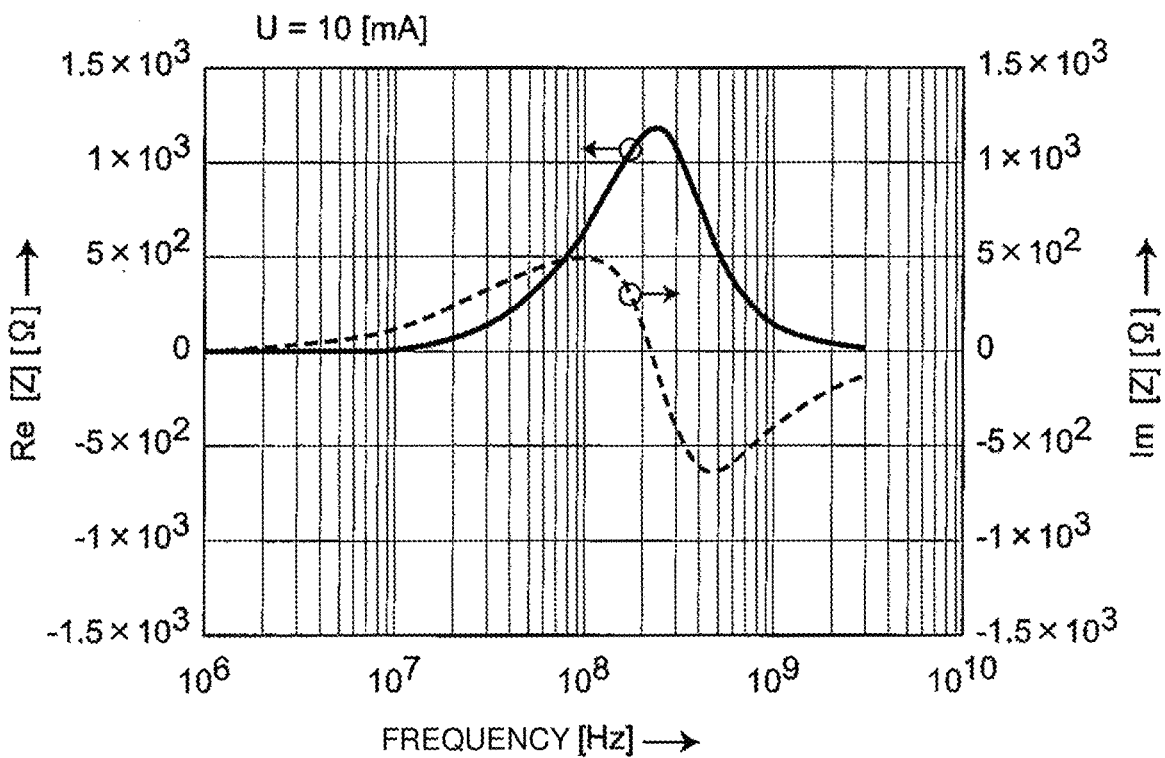
FIG. 4B is a graph illustrating impedance measurement values of a ferrite bead acquired using the impedance measurement system schematically illustrated in FIG. 3 when the DC current value U=10 mA in embodiment 1 and example 1.
Figure 4C:
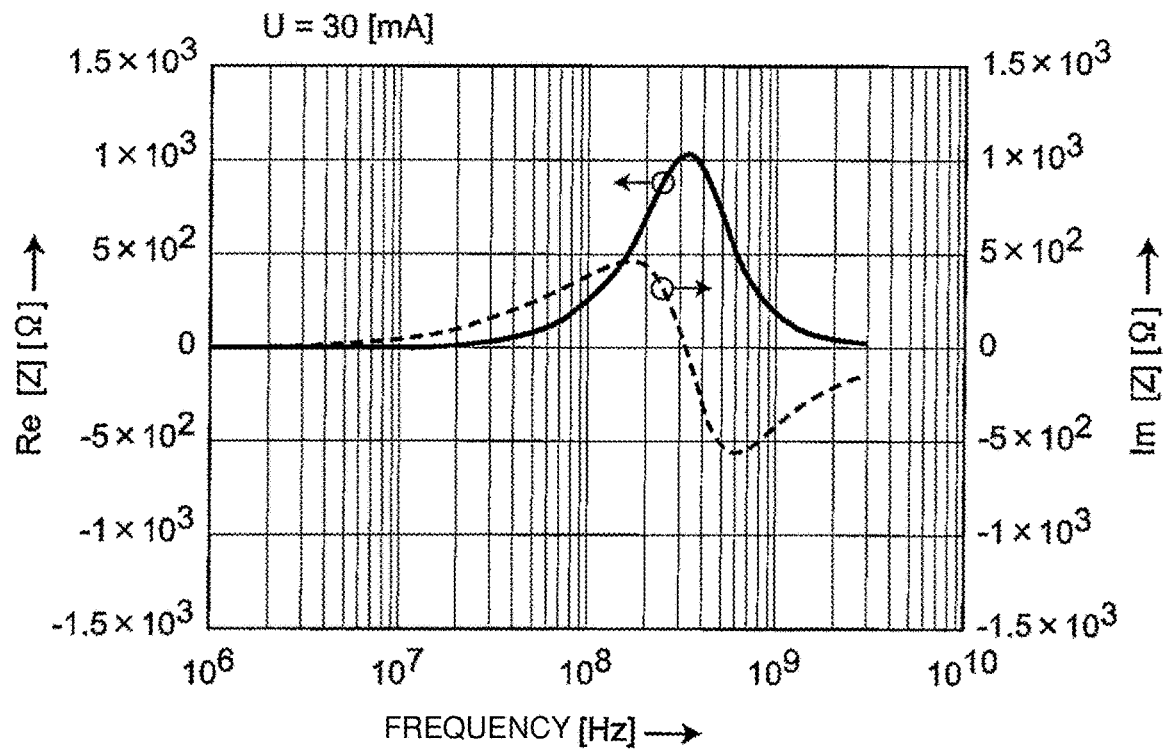
FIG. 4C is a graph illustrating impedance measurement values of a ferrite bead acquired using the impedance measurement system schematically illustrated in FIG. 3 when the DC current value U=30 mA in embodiment 1 and example 1.
Figure 4D:
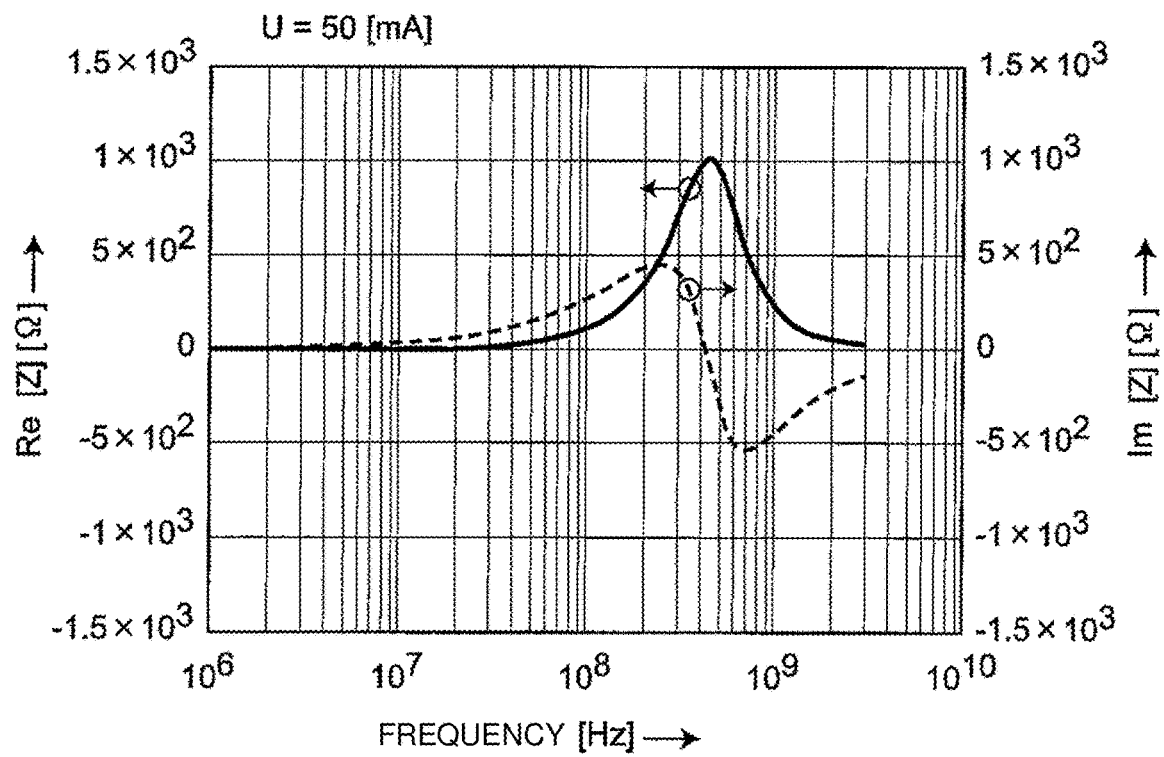
FIG. 4D is a graph illustrating impedance measurement values of a ferrite bead acquired using the impedance measurement system schematically illustrated in FIG. 3 when the DC current value U=50 mA in embodiment 1 and example 1.
Figure 4E:
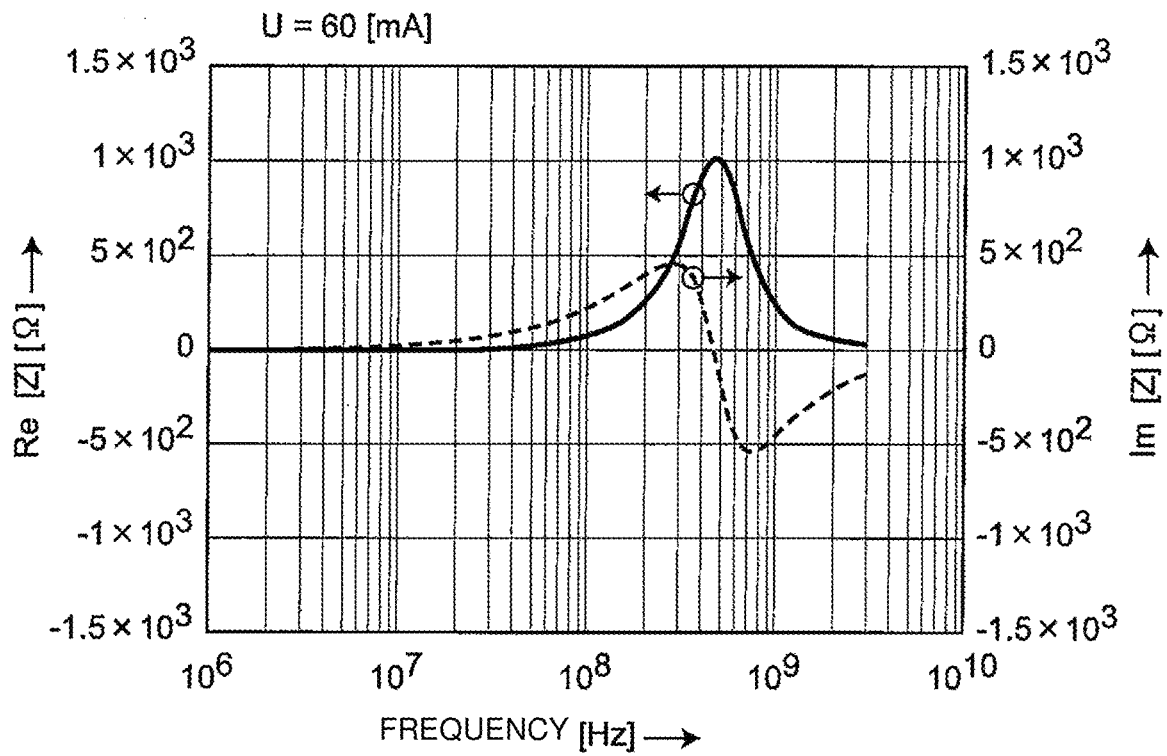
FIG. 4E is a graph illustrating impedance measurement values of a ferrite bead acquired using the impedance measurement system schematically illustrated in FIG. 3 when the DC current value U=60 mA in embodiment 1 and example 1.
Figure 4F:
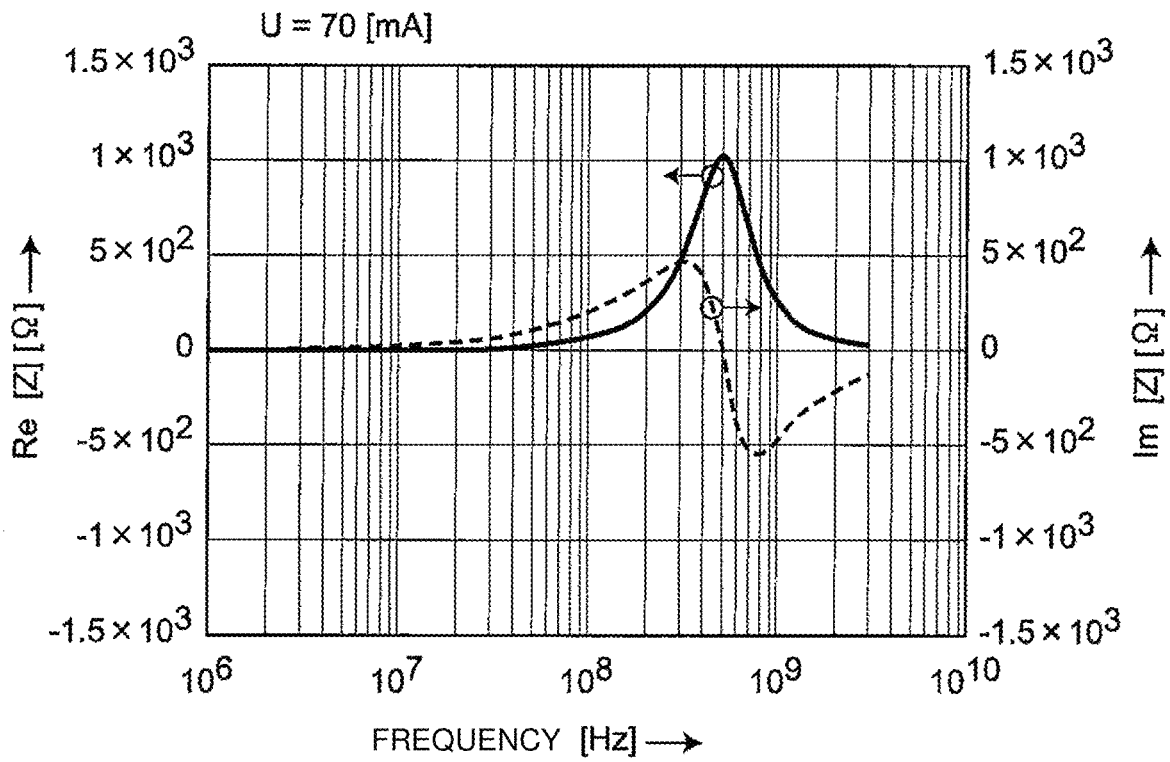
FIG. 4F is a graph illustrating impedance measurement values of a ferrite bead acquired using the impedance measurement system schematically illustrated in FIG. 3 when the DC current value U=70 mA in embodiment 1 and example 1.
Figure 4G:
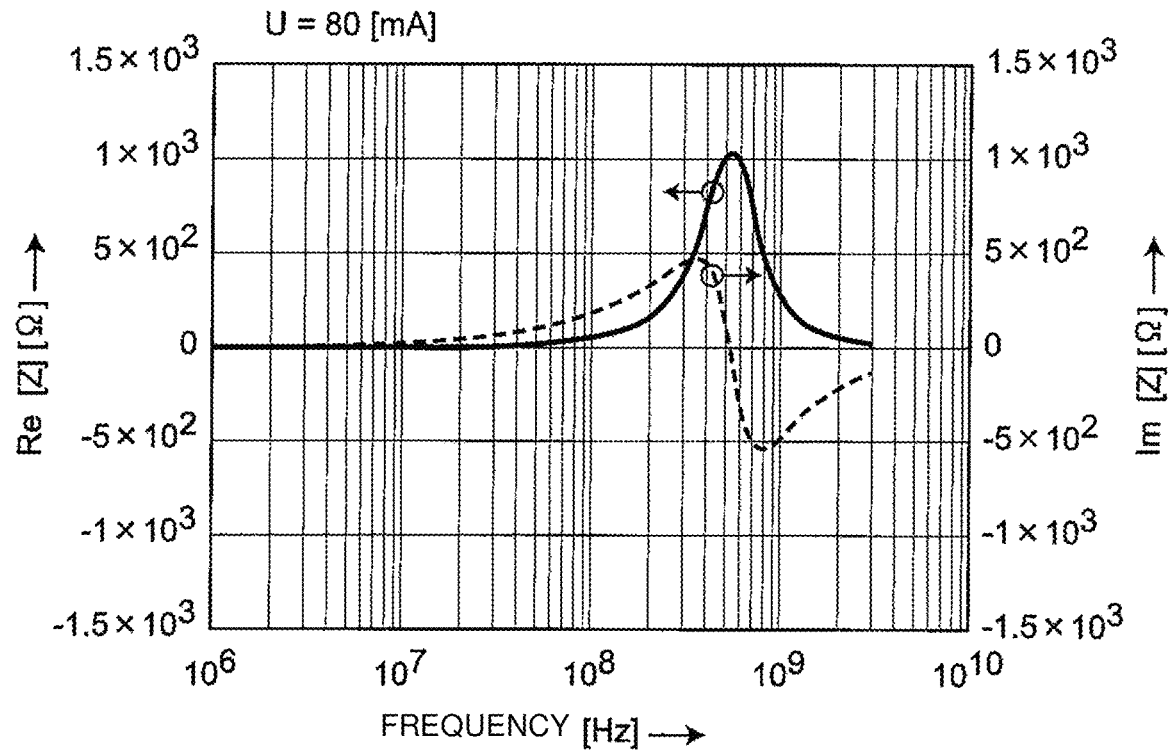
FIG. 4G is a graph illustrating impedance measurement values of a ferrite bead acquired using the impedance measurement system schematically illustrated in FIG. 3 when the DC current value U=80 mA in embodiment 1 and example 1.
Figure 4H:
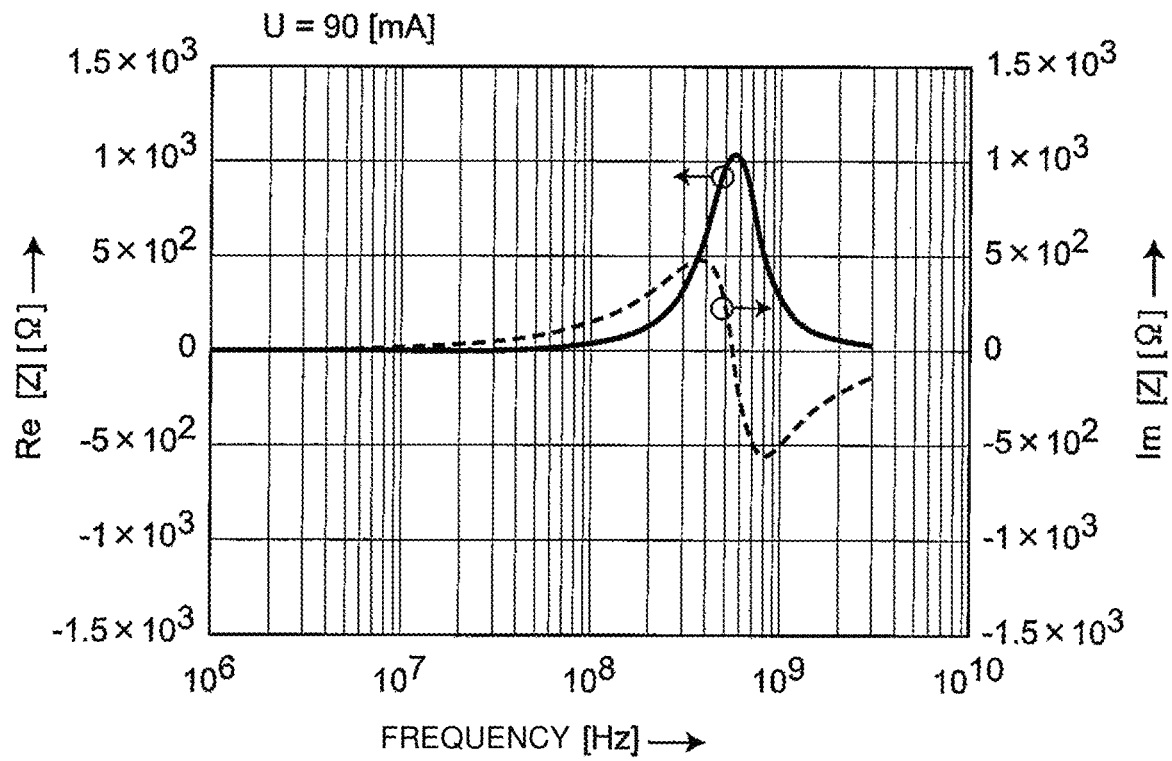
FIG. 4H is a graph illustrating impedance measurement values of a ferrite bead acquired using the impedance measurement system schematically illustrated in FIG. 3 when the DC current value U=90 mA in embodiment 1 and example 1.
Figure 4I:
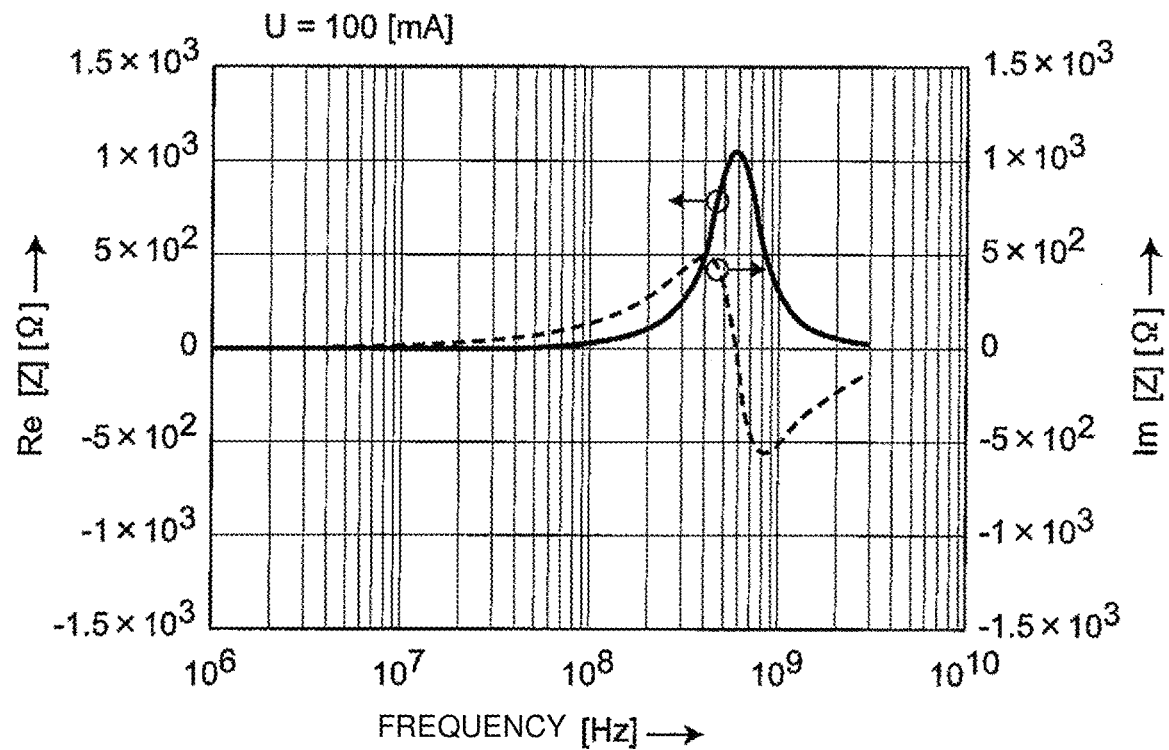
FIG. 4I is a graph illustrating impedance measurement values of a ferrite bead acquired using the impedance measurement system schematically illustrated in FIG. 3 when the DC current value U=100 mA in embodiment 1 and example 1.
Figure 4J:
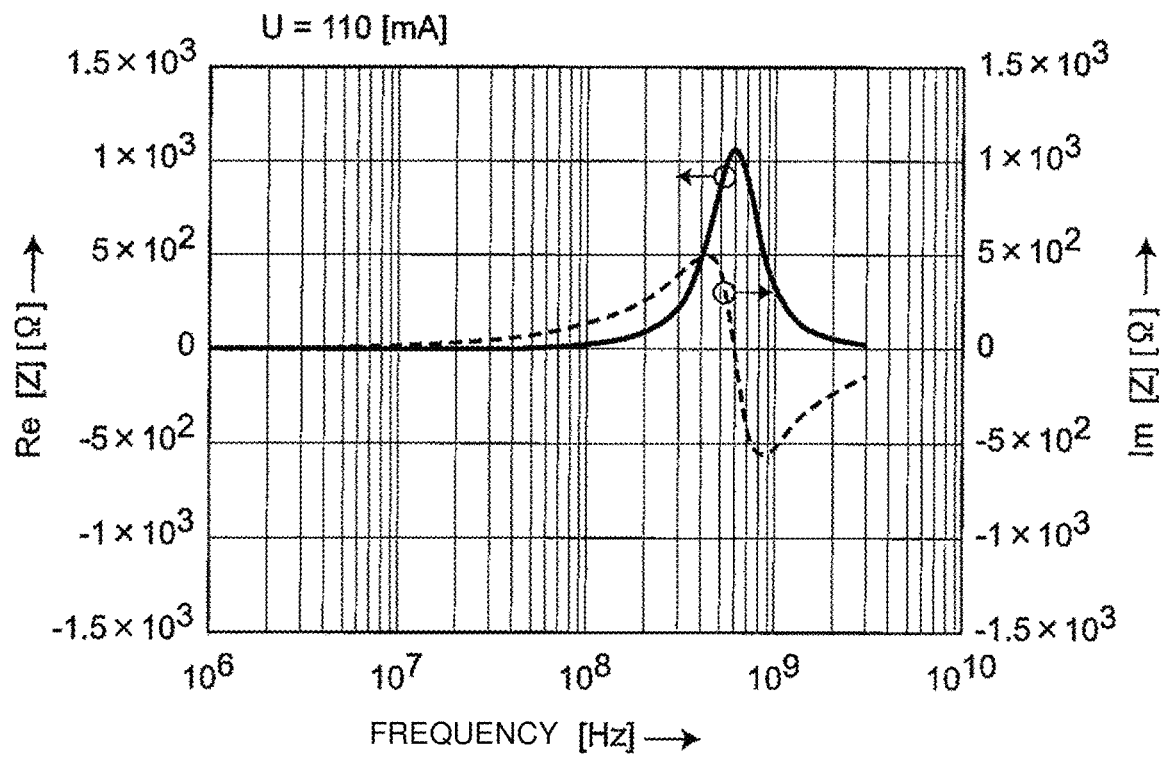
FIG. 4J is a graph illustrating impedance measurement values of a ferrite bead acquired using the impedance measurement system schematically illustrated in FIG. 3 when the DC current value U=110 mA in embodiment 1 and example 1.
Figure 5A:
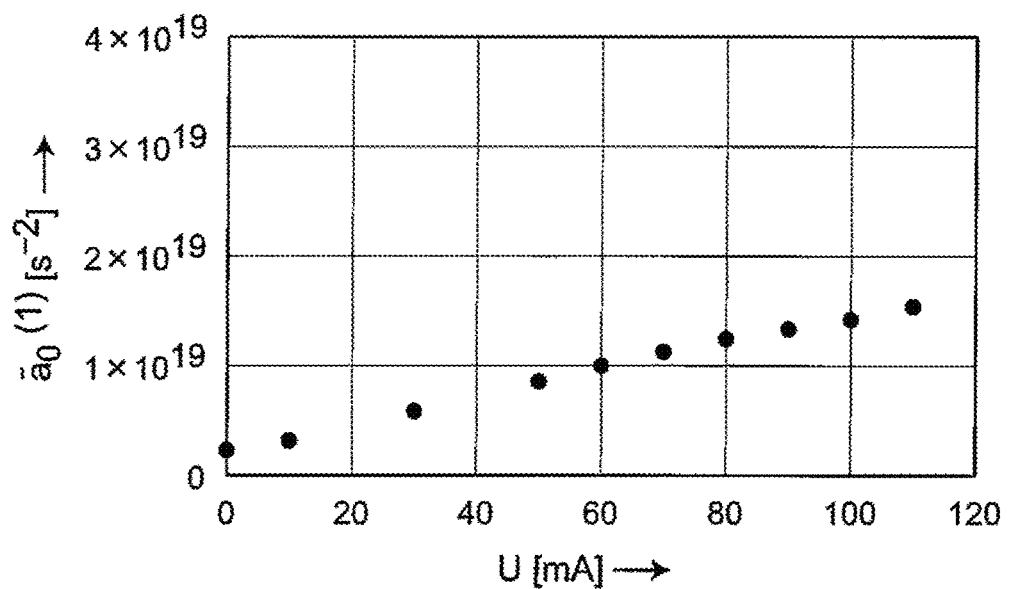
FIG. 5A is a graph of a coefficient obtained when the impedances in FIGS. 4A to 4J are represented using a rational function with respect to the DC current values U.
Figure 5B:
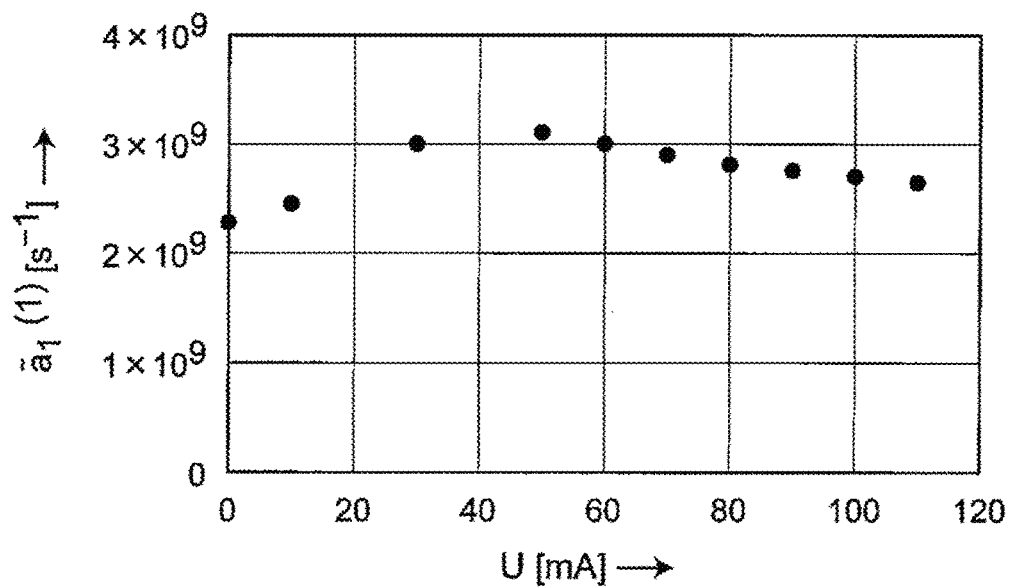
FIG. 5B is a graph of a coefficient obtained when the impedances in FIGS. 4A to 4J are represented using a rational function with respect to the DC current values U.
Figure 5C:
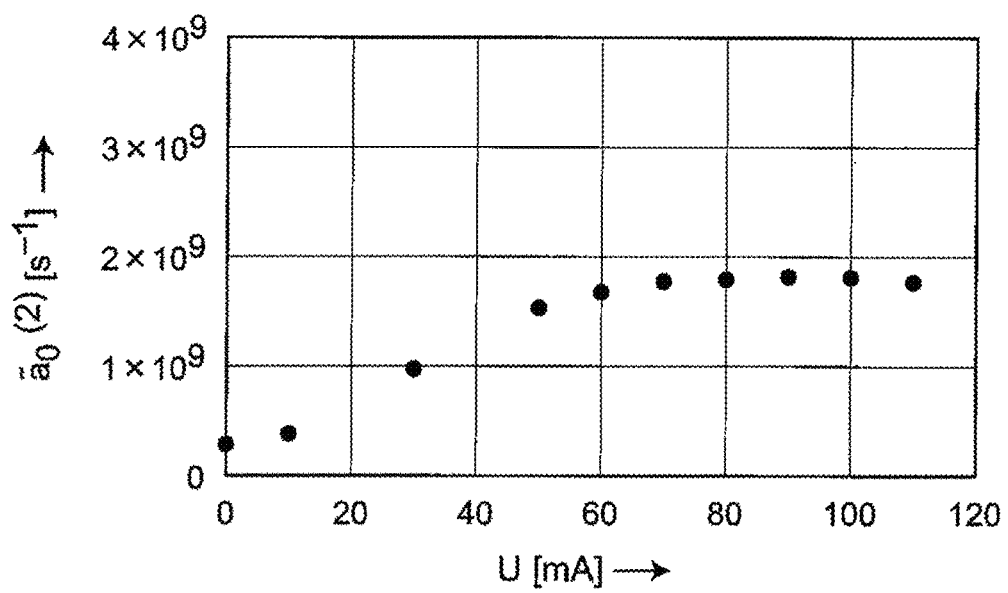
FIG. 5C is a graph of a coefficient obtained when the impedances in FIGS. 4A to 4J are represented using a rational function with respect to the DC current values U.
Figure 5D:
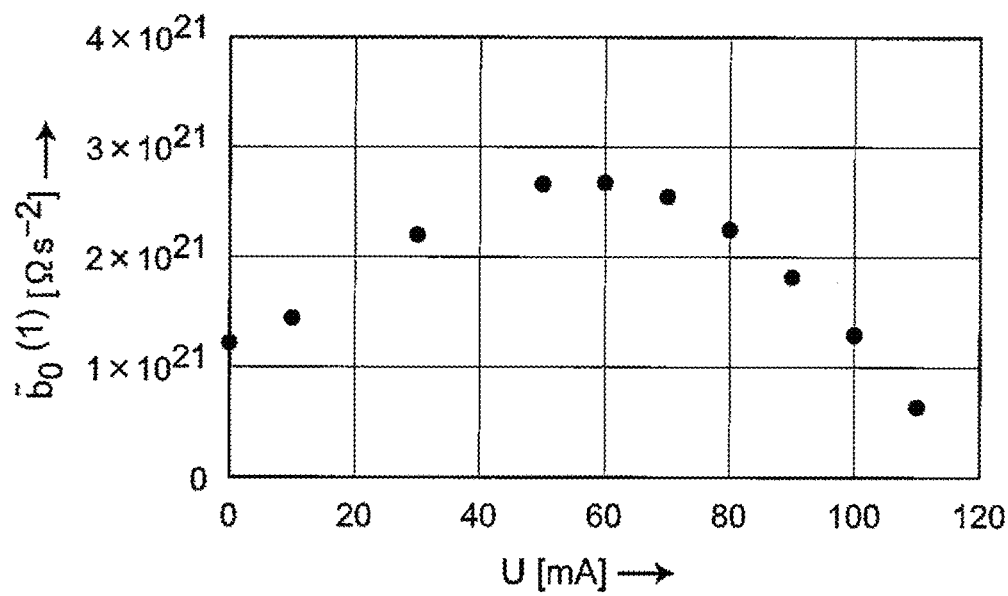
FIG. 5D is a graph of a coefficient obtained when the impedances in FIGS. 4A to 4J are represented using a rational function with respect to the DC current values U.
Figure 5E:
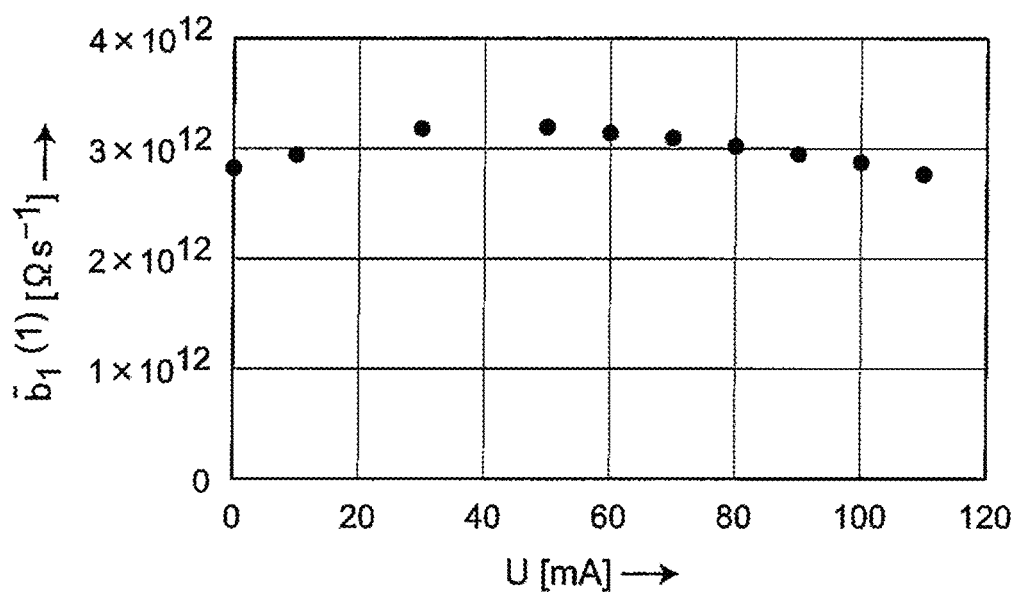
FIG. 5E is a graph of a coefficient obtained when the impedances in FIGS. 4A to 4J are represented using a rational function with respect to the DC current values U.
Figure 5F:
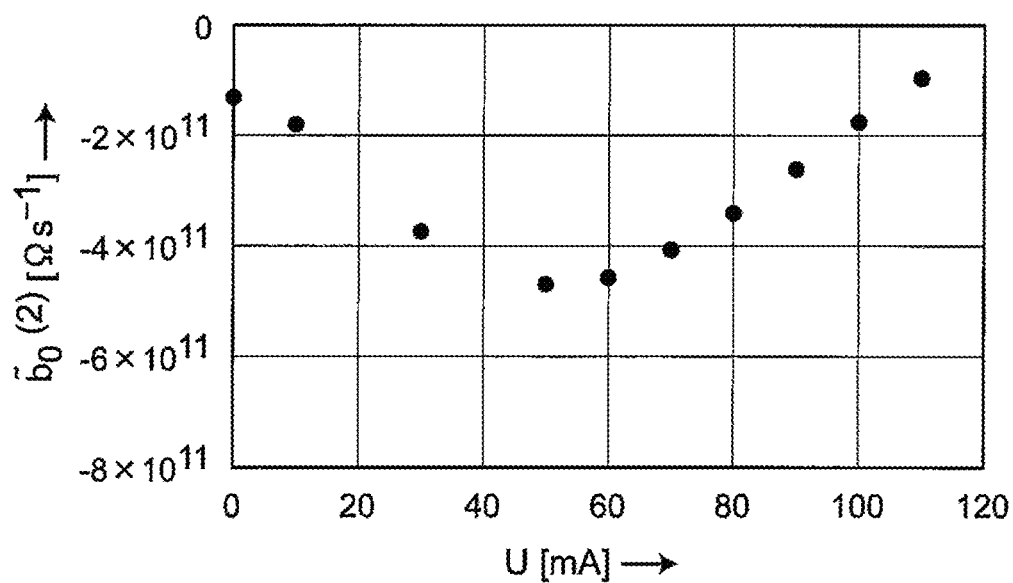
FIG. 5F is a graph of a coefficient obtained when the impedances in FIGS. 4A to 4J are represented using a rational function with respect to the DC current values U.
Figure 5G:
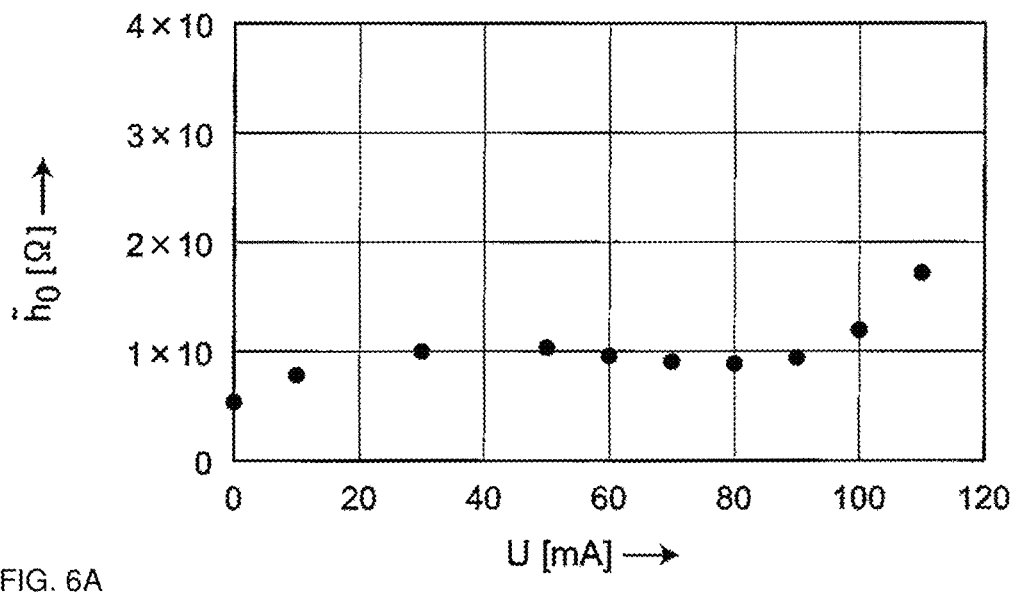
FIG. 5G is a graph of a coefficient obtained when the impedances in FIGS. 4A to 4J are represented using a rational function with respect to the DC current values U.

In a linear device, this response is independent of equilibrium points and is constant, whereas in a non-linear device, the response varies at every equilibrium point due to an inherent non-linearity of the non-linear device. The impedances Re[Z] and Im[Z] of the ferrite bead at various equilibrium points were measured using an impedance meter 100, which is the impedance measurement system schematically illustrated in FIG. 3, while varying the equilibrium value (DC current value) U and the obtained results are illustrated in FIGS. 4A to 4J. In FIG. 3, a to-be-measured device (DUT) 17 is connected to the impedance meter 100. The impedance meter 100 includes an AC current source 11, a DC current source 13, bias T devices 14 and 15, and a voltmeter 16. Here, the bias T devices 14 and 15 are devices for branching a direct current and an alternating current and applying a prescribed current or voltage the to-be-measured device (DUT) 17, the bias T device 14 includes a capacitor C1 and an inductor L1, and the bias T device 15 includes a capacitor C2 and an inductor L2.

Although impedance measurement using the impedance meter 100 is exemplified above, a non-linearity of a non-linear device having a non-linearity that appears as a change in a transfer function at each equilibrium point may be evaluated for various transfer functions, not only impedance, by performing measurements that are easy to carry out using inexpensive commercial facilities. As illustrated in FIGS. 4A to 4J, the impedance at each equilibrium point is different and this clearly indicates that this ferrite bead has a non-linearity.

Since the measured impedance values at the individual equilibrium points form a linear characteristic, the measured impedance values can be expressed with sufficient accuracy for practical purposes by using a rational function as described above. This can be realized, for example, by using a known technique (vector fitting method) as described in "Rational approximation of frequency domain responses by Vector Fitting", B. Gustavsen and A. Semlyen, IEEE Trans. Power Delivery, vol. 14, no. 3, pp. 1052-1061, July 1999, and the expression in formula (1-3) can be easily obtained. Therefore, hereafter, the measurement values are obtained in the form of formula (1-3) and the coefficients in equation (1-3) are also referred to as measurement values. Here, a selected equilibrium point is represented by the input equilibrium value U (DC current value) at that equilibrium point. When a state space representation corresponding to formula (1-3) is expressed as a relationship between minute signals $\hat{u}$, $\hat{y}$, $\hat{x}_1$, and so on, which are minute time-varying signals superimposed on the equilibrium values of the input, output, and state variables, the following formulas (1-4a) and (1-4b) are obtained. Then, the Laplace transform of the input/output ratio between the minute signals is given by formula (1-3). Thus, even for a non-linear device, a state-space representation can be obtained at each individual equilibrium point to represent changes over time such as a transient response of the non-linear device, but the representation can only represent changes over time that are limited to minute signals near individual equilibrium points unlike a linear device.

$$\frac{\tilde{b}_{n-1}(U)s^{n-1} + \ldots + \tilde{b}_1(U)s + \tilde{b}_0(U)}{s^n + \tilde{a}_{n-1}(U)s^{n-1} + \ldots + \tilde{a}_1(U)s + \tilde{a}_0(U)} + \tilde{h}_0(U) + \tilde{h}_1(U)s \quad (1\text{-}3)$$

$$\begin{pmatrix} \dot{\hat{x}}_1 \\ \dot{\hat{x}}_2 \\ \vdots \\ \dot{\hat{x}}_{n-1} \\ \dot{\hat{x}}_n \end{pmatrix} = \begin{pmatrix} 0 & 1 & 0 & \ldots & 0 & 0 \\ 0 & 0 & 1 & \ldots & 0 & 0 \\ \vdots & \vdots & \vdots & & \vdots & \vdots \\ 0 & 0 & 0 & \ldots & 0 & 1 \\ -\tilde{a}_0(U) & -\tilde{a}_1(U) & -\tilde{a}_2(U) & \ldots & -\tilde{a}_{n-2}(U) & -\tilde{a}_{n-1}(U) \end{pmatrix} \begin{pmatrix} \hat{x}_1 \\ \hat{x}_2 \\ \vdots \\ \hat{x}_{n-1} \\ \hat{x}_n \end{pmatrix} + \begin{pmatrix} 0 \\ 0 \\ \vdots \\ 0 \\ 1 \end{pmatrix} \hat{u} \quad (1\text{-}4a)$$

$$\hat{y} = \begin{pmatrix} \tilde{b}_0(U) & \tilde{b}_1(U) & \ldots & \tilde{b}_{n-1}(U) \end{pmatrix} \begin{pmatrix} \hat{x}_1 \\ \hat{x}_2 \\ \vdots \\ \hat{x}_n \end{pmatrix} + \tilde{h}_0(U)\hat{u} + \tilde{h}_1(U)\dot{\hat{u}} \quad (1\text{-}4b)$$

Next, a non-linear model according to an embodiment of the present disclosure will be described. First, a detailed explanation will be given using numerical formulas and so on and then an example of numerical calculations using the measurement values in FIGS. 4A to 4J will be described, as will be described in detail later in example 1.

In order to make it possible to calculate behavior over a wide range not only in the vicinity of equilibrium points for a non-linear ferrite bead, we will consider a non-linear model based on non-linear equations obtained by replacing constant coefficients of a controllable canonical representation that are also coefficients of a transfer function with functions of one state variable $x_1$ as in formulas (1-5) (hereinafter, formulas (1-5a) to (1-5b) are collectively referred to as formulas (1-5), omitting the letters at the ends of the formula numbers). Here, input u and output y are the current flowing to the ferrite bead and the voltage between the terminals, respectively, and $x_1$ to $x_n$ are state variables expanded to the non-linear model. It is possible to calculate time variation of behavior over a wide range without restrictions on the value ranges of the input u, the output y, and the state variables $x_1$ to $x_n$ in accordance with formulas (1-5) by appropriately determining functions $a_0$ to $a_{n-1}$ and $b_0$ to $b_{n-1}$ and functions $h_0$ and $h_1$, which are unknown functions.

The case where the functions $a_0$ to $a_{n-1}$, the functions $b_0$ to $b_{n-1}$, and the functions $h_0$ and $h_1$ are constant corresponds to the case where there is no non-linearity in the ferrite bead, and the non-linear model expressed in formulas (1-5) is a controllable canonical representation, that is, a linear model. Therefore, the non-linear model expressed in formulas (1-5) is a continuous expansion from a linear model and has degrees of freedom to represent non-linearities inherent in the ferrite bead. Therefore, a non-linear model of a ferrite bead can be constructed without estimating the non-linear elements and structure of the non-linear device and thus without the need for knowledge of and insight into the non-linear device, and a wide range of non-linearities possessed by a ferrite bead can be represented. For example, there is an advantage that it is easy to reflect non-linearities that appear in easily performed measurements (in this embodiment, impedance measurements), as will be discussed in detail below.

In order to describe such advantages, the correspondence between this non-linear model and impedance measurement values, i.e., formulas (1-4) will be illustrated. The equilibrium conditions of this non-linear model (state where there are no time variations in the input u, the output y and the state variables $x_1$ to $x_n$) are expressed in upper case for the equilibrium values of the input, the output and the state variables at the equilibrium points (DC operating points) as U, Y and $X_1$ to $X_n$ in the following formulas (1-6). In addition, linear equations that satisfy the minute time-varying signals in the vicinity of the individual equilibrium points, i.e., linear equations that linearize the non-linear model at the individual equilibrium points, are substituted into formulas (1-5) as $U+\hat{u}$, $Y+\hat{y}$, $X_1+\hat{x}_1$, and so on, with there being hats on the minute time-varying signals superimposed on the equilibrium points, and formulas (1-7) are obtained by taking the terms up to the first-order terms of the minute time-varying signals. Here, formulas (1-6) in which the equilibrium conditions are expressed are used.

Formulas (1-6) representing the equilibrium conditions indicate that various equilibrium conditions are established. This embodiment concerns a non-linear model of a ferrite bead where the input is a current and the output is a voltage and consequently this non-linear model also has various DC operating points. The impedances at the DC operating points are obtained by taking the input/output ratio of the Laplace transform of formulas (1-7).

Formulas (1-7) and formulas (1-4) are both in the controllable canonical form and it is easy to express the agreement conditions thereof. In fact, in this embodiment, they can be easily written as formulas (1-8). Therefore, this non-linear model easily reflects non-linearities that appear in impedance measurements. In addition, the greater the number of equilibrium points where agreement conditions are reflected, the more the accuracy of the non-linear model can be improved.

Thus, the non-linear model can be combined with time-series data fitting and so on, which is usually carried out for state space representations, and the non-linear model has an advantage that it is easy to reflect non-linearities that appear in commonly performed and easily executable measurements (in this embodiment, impedance measurements).

$$\begin{pmatrix} \dot{x}_1 \\ \dot{x}_2 \\ \vdots \\ \dot{x}_{n-1} \\ \dot{x}_n \end{pmatrix} = \quad (1\text{-}5a)$$

$$\begin{pmatrix} 0 & 1 & \cdots & 0 & 0 \\ 0 & 0 & \cdots & 0 & 0 \\ \vdots & \vdots & \vdots & \vdots \\ 0 & 0 & \cdots & 0 & 1 \\ -a_0(x_1) & -a_1(x_1) & \cdots & -a_{n-2}(x_1) & -a_{n-1}(x_1) \end{pmatrix} \begin{pmatrix} x_1 \\ x_2 \\ \vdots \\ x_{n-1} \\ x_n \end{pmatrix} + \begin{pmatrix} 0 \\ 0 \\ \vdots \\ 0 \\ 1 \end{pmatrix} u$$

$$y = (b_0(x_1) \ b_1(x_1) \ \cdots \ b_{n-1}(x_1)) \begin{pmatrix} x_1 \\ x_2 \\ \vdots \\ x_n \end{pmatrix} + h_0(u)u + h_1(u)\dot{u} \quad (1\text{-}5b)$$

$$X_2 = X_3 = \ldots = X_n = 0 \quad (1\text{-}6a)$$

$$U \text{ is arbitrary} \quad (1\text{-}6b)$$

$$a_0(X_1)X_1 = U \quad (1\text{-}6c)$$

$$Y = b_0(X_1)X_1 + h_0(U)U \quad (1\text{-}6d)$$

$$\begin{pmatrix} \hat{x}_1 \\ \hat{x}_2 \\ \vdots \\ \hat{x}_{n-1} \\ \hat{x}_n \end{pmatrix} = \quad (1\text{-}7a)$$

$$\begin{pmatrix} 0 & 1 & \cdots & 0 & 0 \\ 0 & 0 & \cdots & 0 & 0 \\ \vdots & \vdots & \vdots & \vdots \\ 0 & 0 & \cdots & 0 & 1 \\ -\begin{pmatrix} a_0(X_1)+ \\ X_1 a_0'(X_1) \end{pmatrix} & -a_1(X_1) & \cdots & -a_{n-2}(X_1) & -a_{n-1}(X_1) \end{pmatrix} \begin{pmatrix} \hat{x}_1 \\ \hat{x}_2 \\ \vdots \\ \hat{x}_{n-1} \\ \hat{x}_n \end{pmatrix} +$$

$$\begin{pmatrix} 0 \\ 0 \\ \vdots \\ 0 \\ 1 \end{pmatrix} \hat{u}$$

$$\hat{y} = (b_0(X_1) + X_1 b_0'(X_1) \ b_1(X_1) \ \cdots \ b_{n-1}(X_1)) \begin{pmatrix} \hat{x}_1 \\ \hat{x}_2 \\ \vdots \\ \hat{x}_n \end{pmatrix} + \quad (1\text{-}7b)$$

$$(h_0(U) + Uh_0'(U))\hat{u} + h_1(U)\dot{\hat{u}}$$

Hereafter, an example of a procedure for reflecting the impedance measurement values in this non-linear model will be described.

The DC current flowing to the ferrite bead can be set to various values, and the impedance is measured at a plurality K of equilibrium points among these values and K sets of measurement values given in formula (1-12), corresponding to formula (1-3), are obtained. Here, the kth equilibrium point is represented by an input equilibrium value (DC current value) $U_k$. In this embodiment, these K sets of measurement values are reflected in the non-linear model.

First, the agreement conditions represented by formulas (1-8) are transformed. Since there are one-to-one correspondences between the equilibrium values U, $X_1$, and Y, one of these three quantities can be independently taken and formulas (1-9) can be obtained from formulas (1-6c) and (1-6d).

Therefore, formulas (1-10) can be obtained as conditions corresponding to formulas (1-8a) and (1-8b). Note that formula (1-8e) can be rewritten as formula (1-11).

Formulas (1-10) and (1-11) are numerically integrated under the physical boundary condition "If the input is 0, then both the output and the state variable are 0, i.e., (U, $X_1$, Y)=(0, 0, 0)"
using $$\{\tilde{a}_0(U_k), \tilde{b}_0(U_k), \tilde{h}_0(U_k)\}_{k=1,\ldots,K}$$

among the coefficient measurement values to specifically calculate function (U, $X_1$), function (U, Y), and function (U, $Uh_0(U)$). After that, function $a_0(X_1)=U/X_1$ is calculated from formula (1-6c) and function $b_0(X_1)=(Y-Uh_0(U))/X_1$ is calculated from formula (1-6d). In addition, function $h_0(U)=(Uh_0(U))/U$ is calculated. Note that (U, $X_1$, Y)=(0, 0, 0) is also one equilibrium point, and although it may seem to be indivisible at that equilibrium point, for example, the following formula is obtained from formula (1-8a).

$$a_0(0)=\tilde{a}_0(0)$$

Similarly, $$b_0(0)=\tilde{b}_0(0)$$

is obtained from formula (1-8b) and $$h_0(0)=\tilde{h}_0(0)$$

is obtained from formula (1-8e).

Functions $a_1(X_1)$ to $a_{n-1}(X_1)$ and functions $b_1(X_1)$ to $b_{n-1}(X_1)$ are calculated using the conditions of functions (U, $X_1$) and formulas (1-8c) and (1-8d). In addition, function $h_1(U)$ is calculated from formula (1-8f).

As described above, functions $a_0$ to $a_{n-1}$, functions $b_0$ to $b_{n-1}$, function $h_0$, and function $h_1$, which are unknown in the non-linear model represented by formulas (1-5), are calculated in the form ($X_1$, $a_0(X_1)$, $a_1(X_1)$, ..., $a_{n-1}(X_1)$, $b_0(X_1)$, $b_1(X_1)$, ..., $b_{n-1}(X_1)$) and (U, $h_0(U)$, $h_1(U)$), and non-linearities appearing in the impedance measurement values are reflected in the non-linear model.

The non-linear model in which the impedance measurement values are reflected is then applied to the circuit diagrams in FIGS. 1 and 2 in order to predict and calculate a non-linear characteristic of the ferrite bead.

$$a_0(X_1) + X_1 a_0'(X_1) = \tilde{a}_0(U) \quad (1\text{-}8a)$$

$$b_0(X_1) + X_1 b_0'(X_1) = \tilde{b}_0(U) \quad (1\text{-}8b)$$

$$a_i(X_1) = \tilde{a}_i(U) \quad (1\text{-}8c)$$
$$(i = 1, \ldots, n-1)$$

$$b_i(X_1) = \tilde{b}_i(U) \quad (1\text{-}8d)$$
$$(i = 1, \ldots, n-1)$$

$$h_0(U) + U h_0'(U) = \tilde{h}_0(U) \quad (1\text{-}8e)$$

$$h_q(U) = \tilde{h}_1(U) \quad (1\text{-}8f)$$

$$\frac{dU}{dX_1} = a_0(X_1) + X_1 a_0'(X_1) \quad (1\text{-}9a)$$

$$\frac{dY}{dX_1} = b_0(X_1) + X_1 b_0'(X_1) + (h_0(U) + U h_0'(U))\frac{dU}{dX_1} \quad (1\text{-}9b)$$

$$\frac{dX_1}{dU} = \frac{1}{\tilde{a}_0(U)} \quad (1\text{-}10a)$$

$$\frac{dY}{dU} = \frac{\tilde{b}_0(U)}{\tilde{a}_0(U)} + \tilde{h}_0(U) \quad (1\text{-}10b)$$

$$\frac{d(U h_0(U))}{dU} = \tilde{h}_0(U) \quad (1\text{-}11)$$

$$\left\{\begin{matrix}\tilde{a}_0(U_k), \tilde{a}_1(U_k), \ldots, \tilde{a}_{n-1}(U_k), \tilde{b}_0(U_k), \\ \tilde{b}_1(U_k), \ldots, \tilde{b}_{n-1}(U_k), \tilde{h}_0(U_k), \tilde{h}_1(U_k)\end{matrix}\right\}_{k=1,\ldots,K} \quad (1\text{-}12)$$

Example 1

Next, an example of calculations performed using the measurement values in FIGS. 4A to 4J will be described. In the non-linear model of a ferrite bead in this example, all non-linear equations are formed of non-linear equations of subsystems up to the second order, in other words, the non-linear model is formed of non-linear equations consisting of a plurality of sets of non-linear equations, each of which is obtained by replacing constant coefficients in a linear state space representation that are also coefficients of a transfer function with functions of one state variable, and in which there are one or two state variables, and an equation whose output is the sum of the outputs of the plurality of sets of non-linear equations.

FIGS. 4A to 4J were obtained through impedance measurements taken at K=10 equilibrium points for equilibrium values (DC current values) of $U_1$=0 mA, $U_2$=10 mA, $U_3$=30 mA, $U_4$=50 mA, $U_5$=60 mA, $U_6$=70 mA, $U_7$=80 mA, $U_8$=90 mA, $U_9$=100 mA, and $U_{10}$=110 mA. Then, a vector fitting method was applied to the impedance measurement values at the respective equilibrium points in order to obtain K=10 sets of the real coefficients $$\{\tilde{a}_0^{(1)}(U_k), \tilde{a}_1^{(1)}(U_k), \tilde{a}_0^{(2)}(U_k), \tilde{b}_0^{(1)}(U_k), \tilde{b}_1^{(1)}(U_k), \tilde{b}_0^{(2)}(U_k), \tilde{h}_0(U_k)\}_{k=1,\ldots,K}$$

of formula (2-4). Graphs of these coefficients plotted against the equilibrium values (DC current values) U are illustrated in FIGS. 5A to 5G. Note that the non-linearity of the remaining coefficient $\tilde{h}_1$ was negligible and was therefore regarded as being a constant (2.268×10$^{-10}$). As mentioned earlier, these coefficients are also referred to below as measurement values. In formula (2-4), the rational function is divided into two terms, but the same form as in formula (1-3) is obtained if the two terms are added together. Such division may be performed through partial fractional expansion of a rational function. Using these coefficients, the state space representation at each equilibrium point is expressed by formulas (2-5).

A non-linear model of a ferrite bead is formed using two subsystems of a second order and a first order as illustrated in formulas (2-1). The input u and the output y are the current flowing to the ferrite bead and the voltage between the terminals, respectively. $x_1$, $x_2$ and $x_3$ are state variables expanded to the non-linear model, with $x_1$ and $x_2$ belonging to the second-order subsystem and $x_3$ belonging to the first-order subsystem. The superscript at the upper right of a function indicates the number of the subsystem. In addition, $h_1$ is a constant. Each subsystem consists of non-linear equations obtained by replacing constant coefficients in the controllable canonical representation that are also coefficients of the transfer function with functions of one state variable as in the first and second row parts in formula (2-1a) and formula (2-1c) for $x_1$ and $x_2$ and the third row part in formula (2-1a) and formula (2-1d) for $x_3$, each of which is the same as in embodiment 1. The non-linear model is formed by non-linear equations consisting of these two sets of non-linear equations and the equation given by formula (2-1b), whose output is the sum of the outputs of the two sets of non-linear equations. Time variation of behavior over a wide range can be calculated in accordance with formulas (2-1) by appropriately determining the unknown functions $a_0^{(1)}$, $a_1^{(1)}$, $a_0^{(2)}$, $b_0^{(1)}$, $b_1^{(1)}$, $b_0^{(2)}$, $h_0$, and the unknown constant $h_1$.

The equilibrium conditions for the non-linear model represented by formulas (2-1) are given by formulas (2-2) and linear equations obtained by linearizing the non-linear model near the individual equilibrium points are given by formulas (2-3). The uppercase letters represent the equilibrium values of the quantities represented by the corresponding lowercase letters.

$$\begin{pmatrix}\dot{x}_1 \\ \dot{x}_2 \\ \dot{x}_3\end{pmatrix} = \begin{pmatrix} 0 & 1 & 0 \\ -a_0^{(1)}(x_1) & -a_1^{(1)}(x_1) & 0 \\ 0 & 0 & -a_0^{(2)}(x_3)\end{pmatrix}\begin{pmatrix}x_1 \\ x_2 \\ x_3\end{pmatrix} + \begin{pmatrix}0 \\ 1 \\ 1\end{pmatrix}u \quad (2\text{-}1a)$$

$$y = y^{(1)} + y^{(2)} \quad (2\text{-}1b)$$

$$y^{(1)} = \begin{pmatrix}b_0^{(1)}(x_1) & b_1^{(1)}(x_1)\end{pmatrix}\begin{pmatrix}x_1 \\ x_2\end{pmatrix} + h_0(u)u + h_1\dot{u} \quad (2\text{-}1c)$$

$$y^{(2)} = b_0^{(2)}(x_3)x_3 \quad (2\text{-}1d)$$

$$X_2 = 0 \quad (2\text{-}2a)$$

$$U \text{ is arbitrary} \quad (2\text{-}2b)$$

$$a_0^{(1)}(X_1)X_1 = U \quad (2\text{-}2c)$$

$$a_0^{(2)}(X_3)X_3 = U \quad (2\text{-}2d)$$

$$Y = b_0^{(1)}(X_1)X_1 + b_0^{(2)}(X_3)X_3 + h_0(U)U \quad (2\text{-}2e)$$

$$\begin{pmatrix}\dot{\hat{x}}_1 \\ \dot{\hat{x}}_2 \\ \dot{\hat{x}}_3\end{pmatrix} = \begin{pmatrix} 0 & 1 & 0 \\ -\begin{pmatrix}a_0^1(X_1)+ \\ X_1 a_0^{(1)\prime}(X_1)\end{pmatrix} & -a_1^{(1)}(X_1) & 0 \\ 0 & 0 & -\begin{pmatrix}a_0^{(2)}(X_3)+ \\ X_3 a_0^{(2)\prime}(X_3)\end{pmatrix}\end{pmatrix}\begin{pmatrix}\hat{x}_1 \\ \hat{x}_2 \\ \hat{x}_3\end{pmatrix} + \begin{pmatrix}0 \\ 1 \\ 1\end{pmatrix}\hat{u} \quad (2\text{-}3a)$$

$$y - \begin{pmatrix}b_0^{(1)}(X_1) + X_1 b_0^{(1)\prime}(X_1) & b_1^{(1)}(X_1) & b_0^{(2)}(X_3) + X_3 b_0^{(2)\prime}(X_3)\end{pmatrix}\begin{pmatrix}x_1 \\ x_2 \\ x_3\end{pmatrix} + \quad (2\text{-}3b)$$

$$(h_0(U) + U h_0'(U))\hat{u} + h_1\dot{\hat{u}}$$

Hereafter, a procedure used to reflect the impedance measurement values in the nonlinear model in this example will be described.

There are one-to-one correspondences between the equilibrium values U, $X_1$ and $X_3$ at the equilibrium points, and therefore formulas (2-6) are obtained by differentiating both sides of formulas (2-2c) and (2-2d). Then, from formulas (2-6) and formulas (2-7), the agreement conditions for formulas (2-3) and formulas (2-5) are given by formulas (2-8). Thus, this non-linear model also has the advantage that non-linearities appearing in general impedance measurements are easily reflected.

$$\frac{\tilde{b}_1^{(1)}(U)s + \tilde{b}_0^{(1)}(U)}{s^2 + \tilde{a}_1^{(1)}(U)s + \tilde{a}_0^{(1)}(U)} + \frac{\tilde{b}_0^{(2)}(U)}{s + \tilde{a}_0^{(2)}(U)} + \tilde{h}_0(U) + \tilde{h}_1 s \quad (2\text{-}4)$$

$$\begin{pmatrix} \hat{x}_1 \\ \hat{x}_2 \\ \hat{x}_3 \end{pmatrix} = \begin{pmatrix} 0 & 1 & 0 \\ -\tilde{a}_0^{(1)}(U) & -\tilde{a}_1^{(1)}(U) & 0 \\ 0 & 0 & -\tilde{a}_0^{(2)}(U) \end{pmatrix} \begin{pmatrix} \hat{x}_1 \\ \hat{x}_2 \\ \hat{x}_3 \end{pmatrix} + \begin{pmatrix} 0 \\ 1 \\ 1 \end{pmatrix} \hat{u} \quad (2\text{-}5a)$$

$$y = \begin{pmatrix} \tilde{b}_0^{(1)}(U) & \tilde{b}_1^{(1)}(U) & \tilde{b}_0^{(2)}(U) \end{pmatrix} \begin{pmatrix} x_1 \\ x_2 \\ x_3 \end{pmatrix} + \tilde{h}_0(U)\hat{u} + h_1 \hat{u} \quad (2\text{-}5b)$$

$$\frac{dU}{dX_1} = a_0^{(1)}(X_1) + X_1 a_0^{(1)\prime}(X_1) \quad (2\text{-}6a)$$

$$\frac{dU}{dX_3} = a_0^{(2)}(X_3) + X_3 a_0^{(2)\prime}(X_3) \quad (2\text{-}6b)$$

$$\frac{d(X_1 b_0^{(1)}(X_1))}{dX_1} = b_0^{(1)}(X_1) + X_1 b_0^{(1)\prime}(X_1) \quad (2\text{-}7a)$$

$$\frac{d(X_3 b_0^{(2)}(X_3))}{dX_3} = b_0^{(2)}(X_3) + X_3 b_0^{(2)\prime}(X_3) \quad (2\text{-}7b)$$

$$\frac{d(Uh_0(U))}{dU} = h_0(U) + Uh_0'(U) \quad (2\text{-}7c)$$

$$\frac{dX_1}{dU} = \frac{1}{\tilde{a}_0^{(1)}(U)} \quad (2\text{-}8a)$$

$$\frac{dX_3}{dU} = \frac{1}{\tilde{a}_0^{(2)}(U)} \quad (2\text{-}8b)$$

$$\frac{d(X_1 b_0^{(1)}(X_1))}{dX_1} = \tilde{b}_0^{(1)}(U) \quad (2\text{-}8c)$$

$$\frac{d(X_3 b_0^{(2)}(X_3))}{dX_3} = \tilde{b}_0^{(2)}(U) \quad (2\text{-}8d)$$

$$\frac{d(Uh_0(U))}{dU} = \tilde{h}_0(U) \quad (2\text{-}8e)$$

$$a_1^{(1)}(X_1) = \tilde{a}_1^{(1)}(U) \quad (2\text{-}8f)$$

$$b_1^{(1)}(X_1) = \tilde{b}_1^{(1)}(U) \quad (2\text{-}8g)$$

$$h_1 = \tilde{h}_1 \quad (2\text{-}8h)$$

Figure 6A:
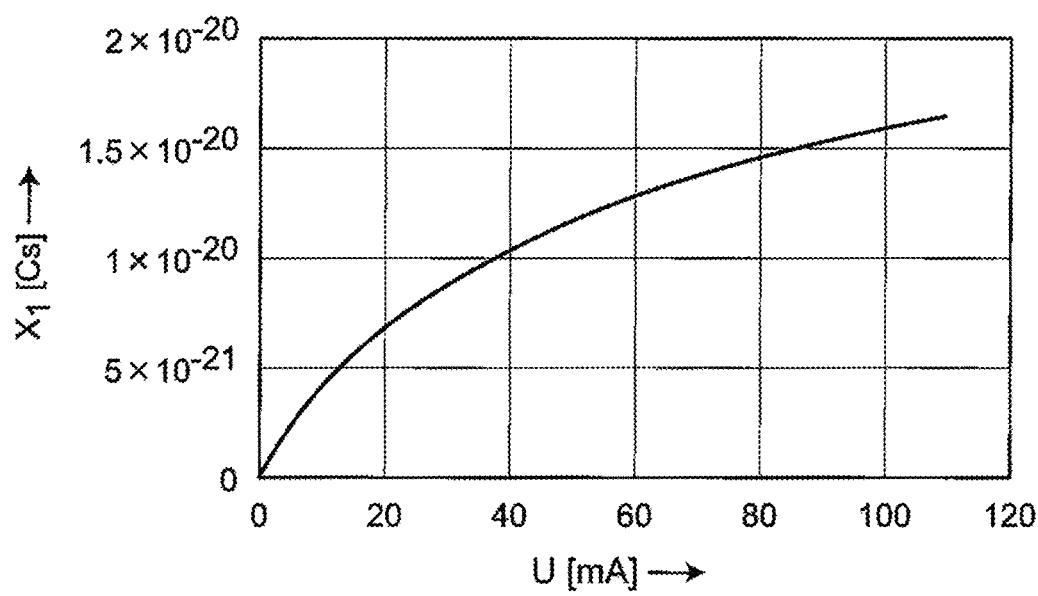
FIG. 6A is a graph illustrating a function that relates an input equilibrium value (DC current value) U and an equilibrium value $X_1$ of a state variable, which is expanded to a non-linear model, as calculated in example 1.
Figure 6B:
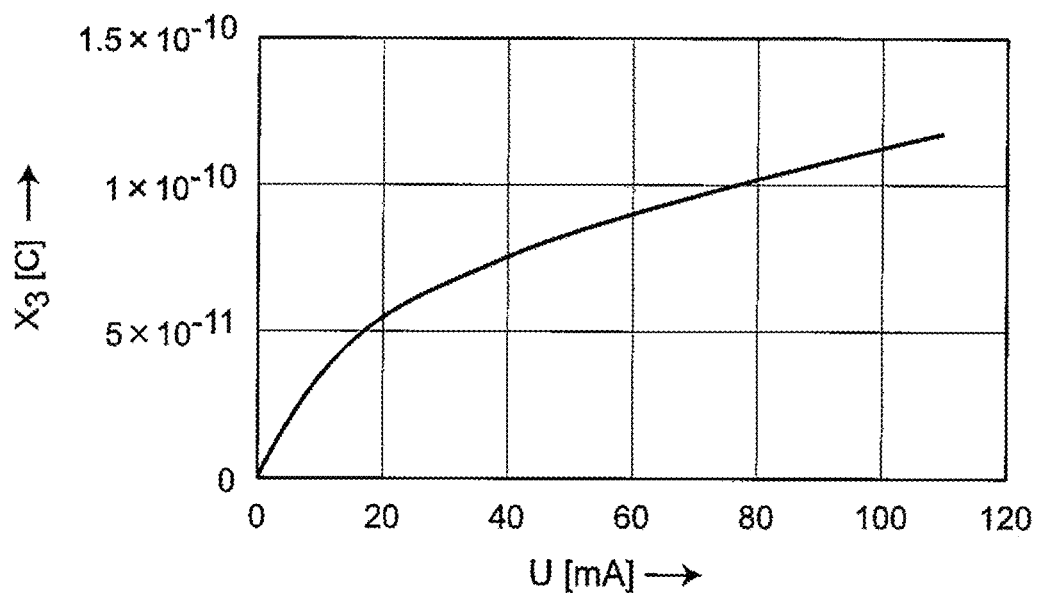
FIG. 6B is a graph illustrating a function that relates an input equilibrium value (DC current value) U and an equilibrium value $X_3$ of a state variable, which is expanded to a non-linear model, as calculated in example 1.
Figure 7A:
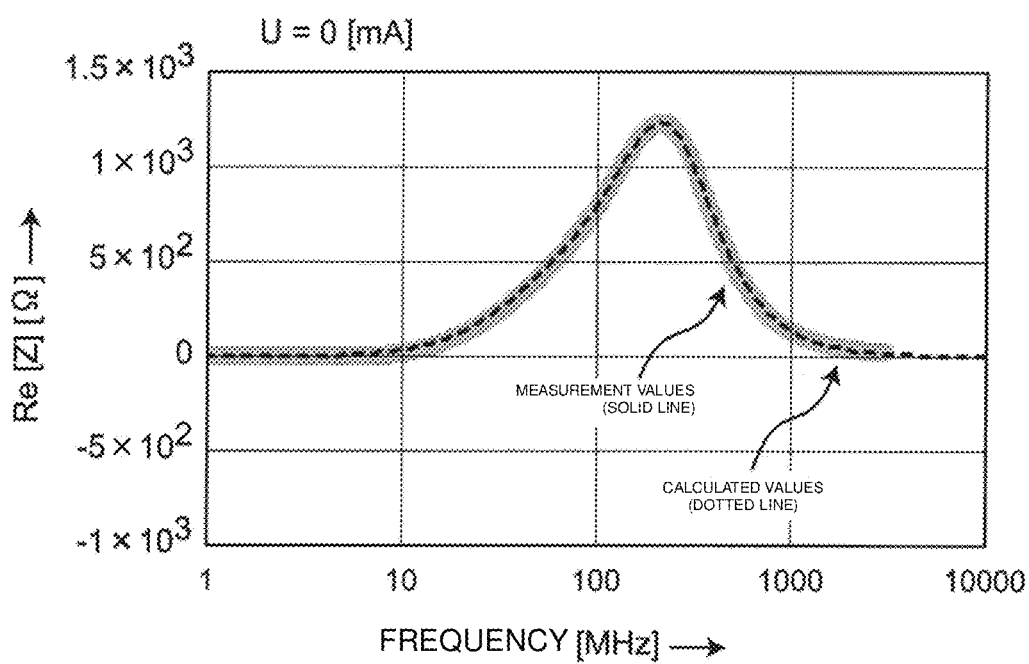
FIG. 7A is a graph comparing the calculated values of the non-linear model in example 1 and the measurement values in FIG. 4A for impedance Re[Z] when the DC current value U=0 mA.
Figure 7B:
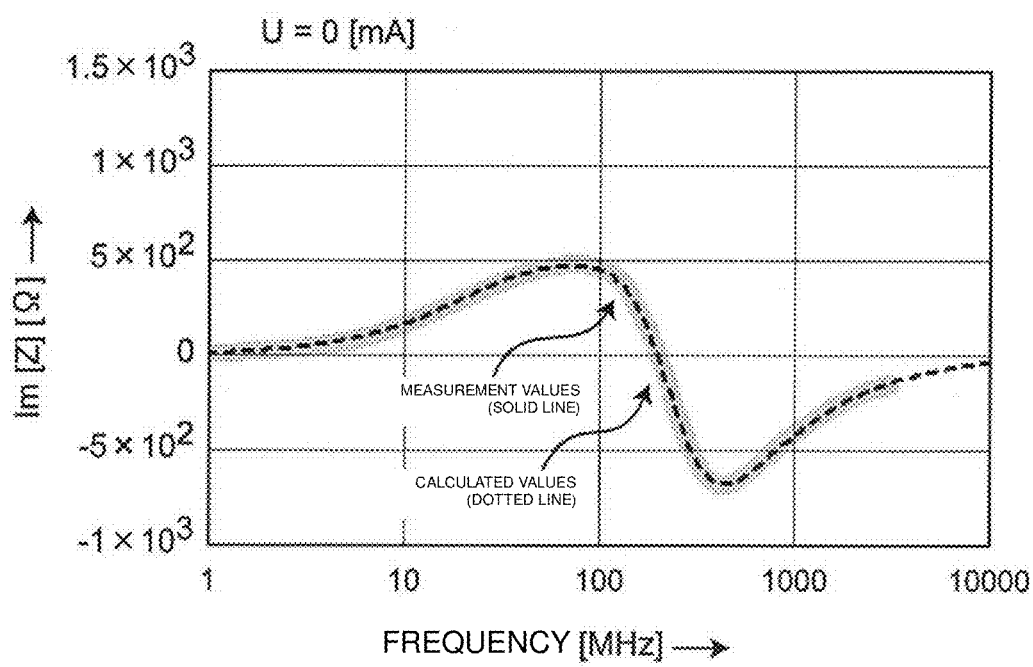
FIG. 7B is a graph comparing the calculated values of the non-linear model in example 1 and the measurement values in FIG. 4A for impedance Im[Z] when the DC current value U=0 mA.
Figure 7C:
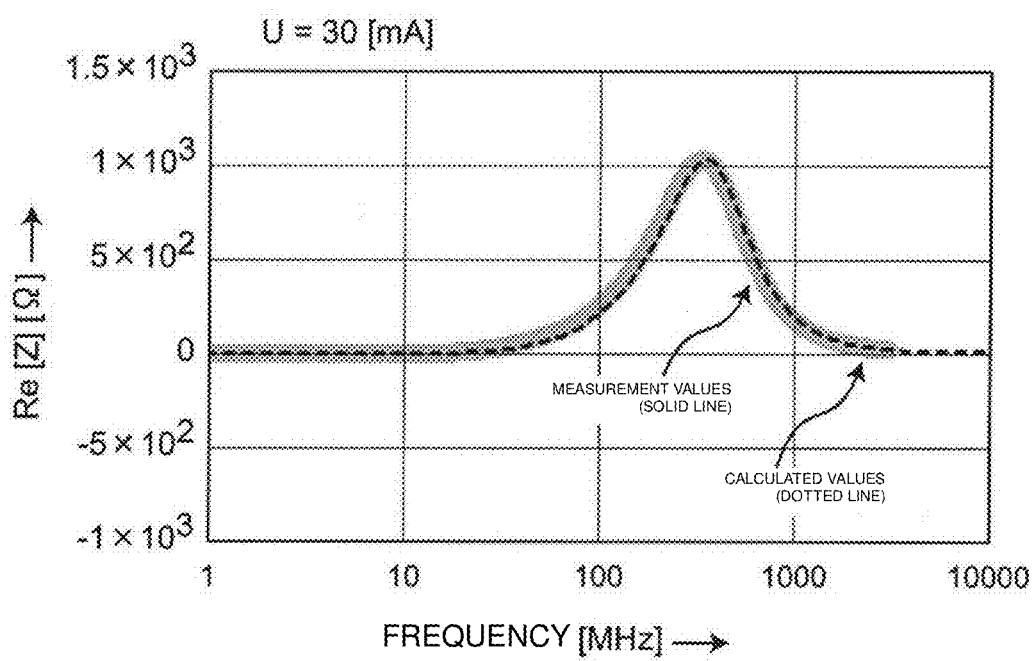
FIG. 7C is a graph comparing the calculated values of the non-linear model in example 1 and the measurement values in FIG. 4C for impedance Re[Z] when the DC current value U=30 mA.
Figure 7D:
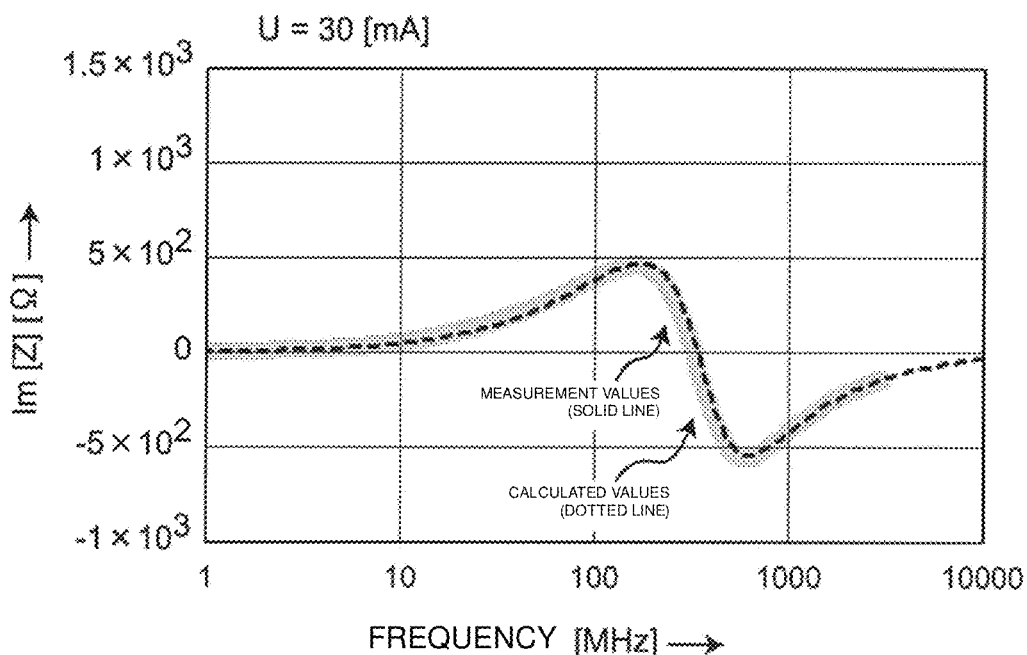
FIG. 7D is a graph comparing the calculated values of the non-linear model in example 1 and the measurement values in FIG. 4C for impedance Im[Z] when the DC current value U=30 mA.
Figure 7E:
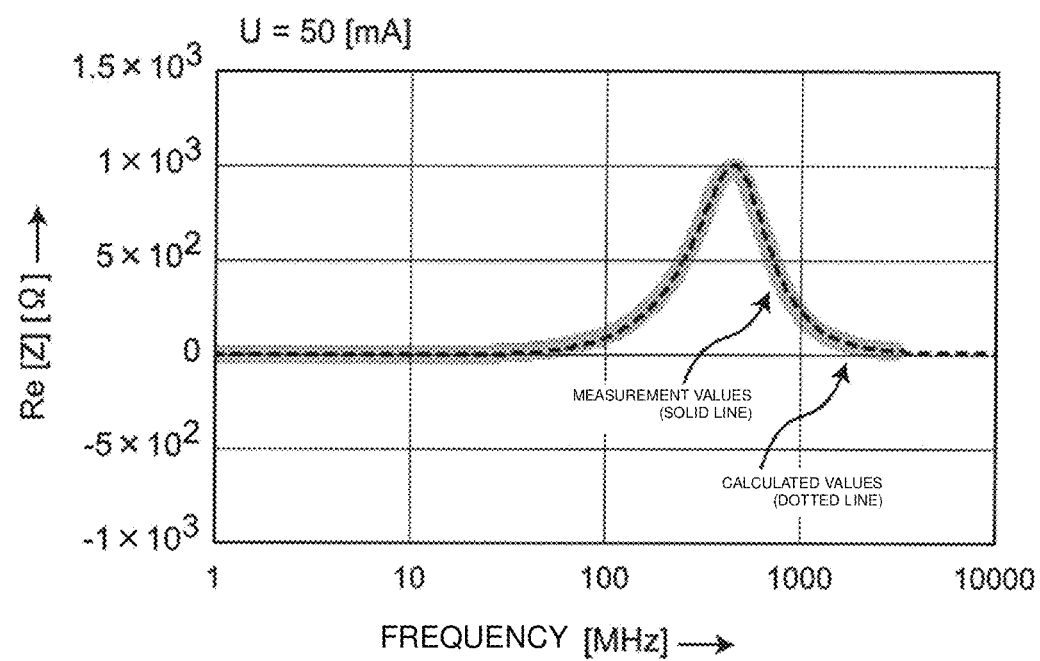
FIG. 7E is a graph comparing the calculated values of the non-linear model in example 1 and the measurement values in FIG. 4D for impedance Re[Z] when the DC current value U=50 mA.
Figure 7F:
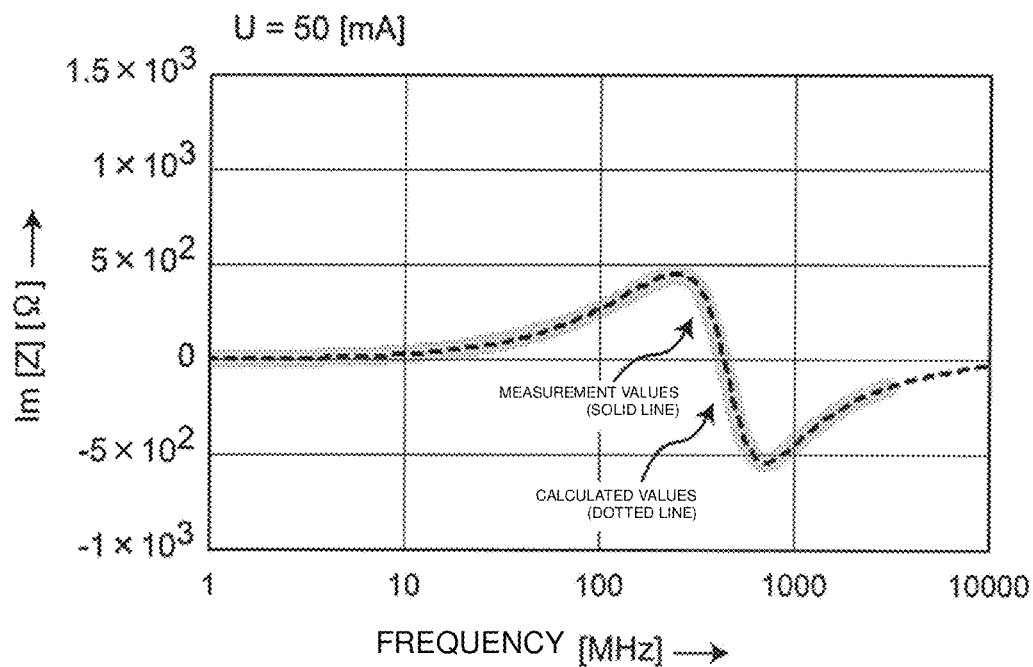
FIG. 7F is a graph comparing the calculated values of the non-linear model in example 1 and the measurement values in FIG. 4D for impedance Im[Z] when the DC current value U=50 mA.
Figure 7G:
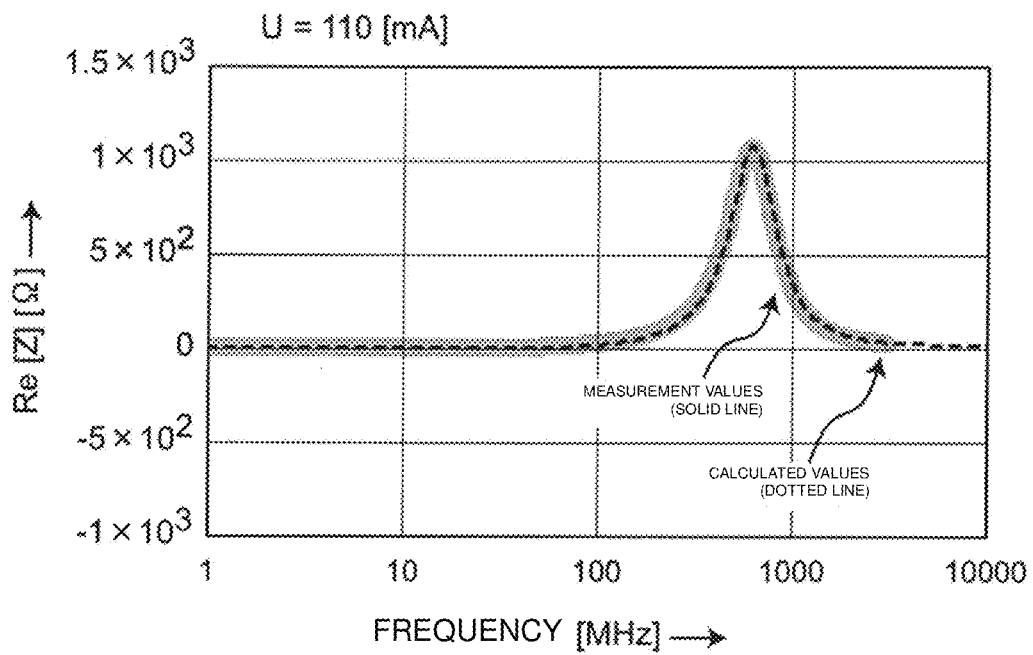
FIG. 7G is a graph comparing the calculated values of the non-linear model in example 1 and the measurement values in FIG. 4J for impedance Re[Z] when the DC current value U=110 mA.
Figure 7H:
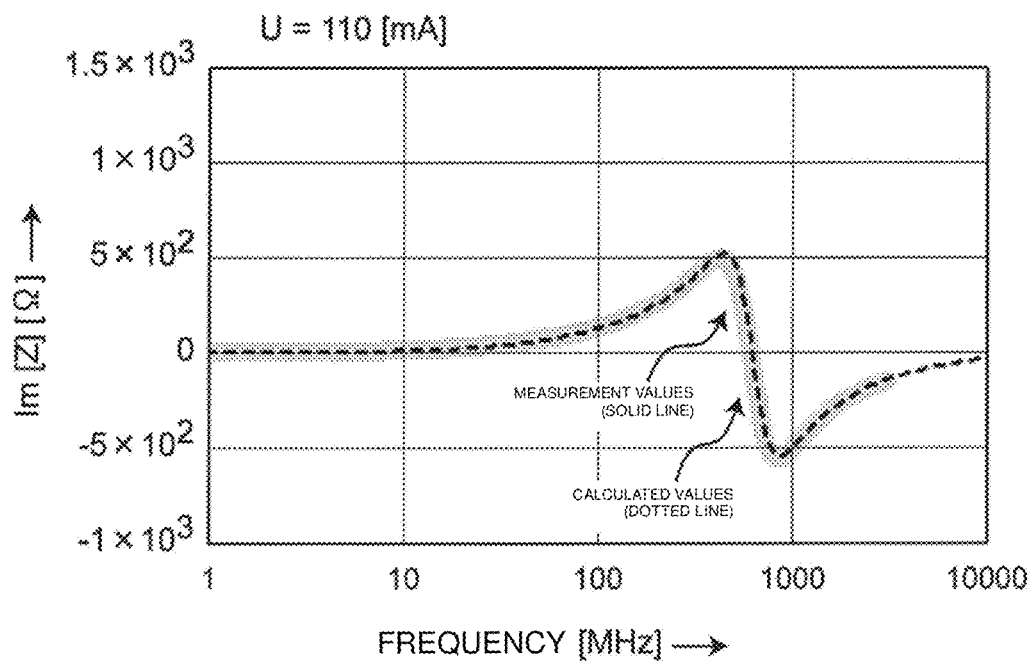
FIG. 7H is a graph comparing the calculated values of the non-linear model in example 1 and the measurement values in FIG. 4J for impedance Im[Z] when the DC current value U=110 mA.

Functions (U, $X_1$) and (U, $X_3$) are obtained by numerically integrating formula (2-8a) and formula (2-8b) under the physical boundary condition "If the input is 0, the state variable is also 0" using $$\{\tilde{a}_0^{(1)}(U_k), \tilde{a}_0^{(2)}(U_k)\}_{k=1,\ldots,K}$$

among the coefficient measurement values. FIGS. 6A to 6B illustrate the waveforms obtained as described above. Since the measurement values are discrete, the values are appropriately interpolated using polynomials and so forth.

Then, using the obtained functions (U, $X_1$) and (U, $X_3$), $a_0^{(1)}(X_1)$ and $a_0^{(2)}(X_3)$ are obtained from formulas (2-2c) and (2-2d), $a_1^{(1)}(X_1)$ and $b_1^{(1)}(X_1)$ are obtained from formulas (2-7f) and (2-7g), and functions $b_0^{(1)}(X_1)$ and $b_0^{(2)}(X_3)$ are calculated by numerically integrating formulas (2-8c) and (2-8d). In addition, function $h_0(U)$ is calculated by numerically integrating formula (2-8e).

Thus, the unknown functions $a_0^{(1)}$, $a_1^{(1)}$, $a_0^{(2)}$, $b_0^{(1)}$, $b_1^{(1)}$, $b_0^{(2)}$ and $h_0$ in the nonlinear model represented by formulas (2-1) are calculated in the form of functions ($X_1$, $a_0^{(1)}(X_1)$, $a_1^{(1)}(X_1)$, $a_0^{(2)}(X_3)$, $b_0^{(1)}(X_1)$, $b_1^{(1)}(X_1)$, $b_0^{(2)}(X_3)$), and (U, $h_0(U)$) to reflect a nonlinearity that appears in the impedance measurement values in the non-linear model. The constant $h_1$ is obtained from formula (2-8h).

In this example, the numerically obtained functions were further applied to polynomial equations. However, the functions may instead be applied to other functions, such as spline functions or may be used as discrete numbers as table data.

FIGS. 7A to 7H illustrate results obtained by applying the obtained non-linear model to the circuit diagram in FIG. 2 and comparing the non-linear model with measurement values at several equilibrium points. It is clear from FIGS. 7A to 7H that the nonlinear model is able to well reflect a non-linearity that appears in the impedance measurements of a ferrite bead illustrated in FIGS. 4A to 4J.

Figure 8A:
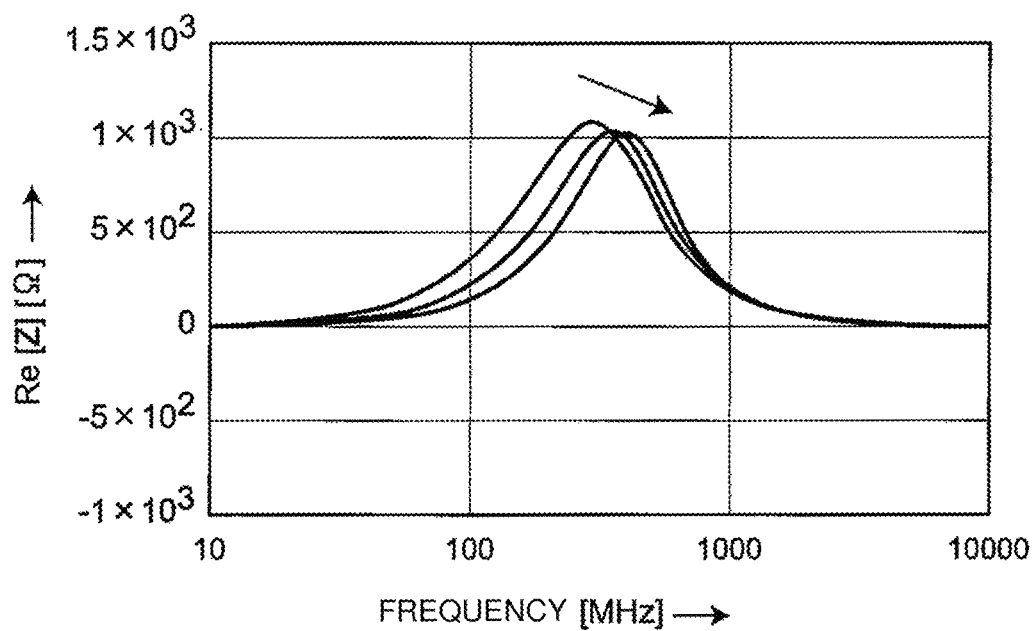
FIG. 8A is a graph illustrating an example of changes in the impedance Re[Z] of a ferrite bead when the input equilibrium value (DC current value) U is increased as U=20 mA, 30 mA, and 40 mA in example 1 as calculated using the circuit diagram in FIG. 2.
Figure 8B:
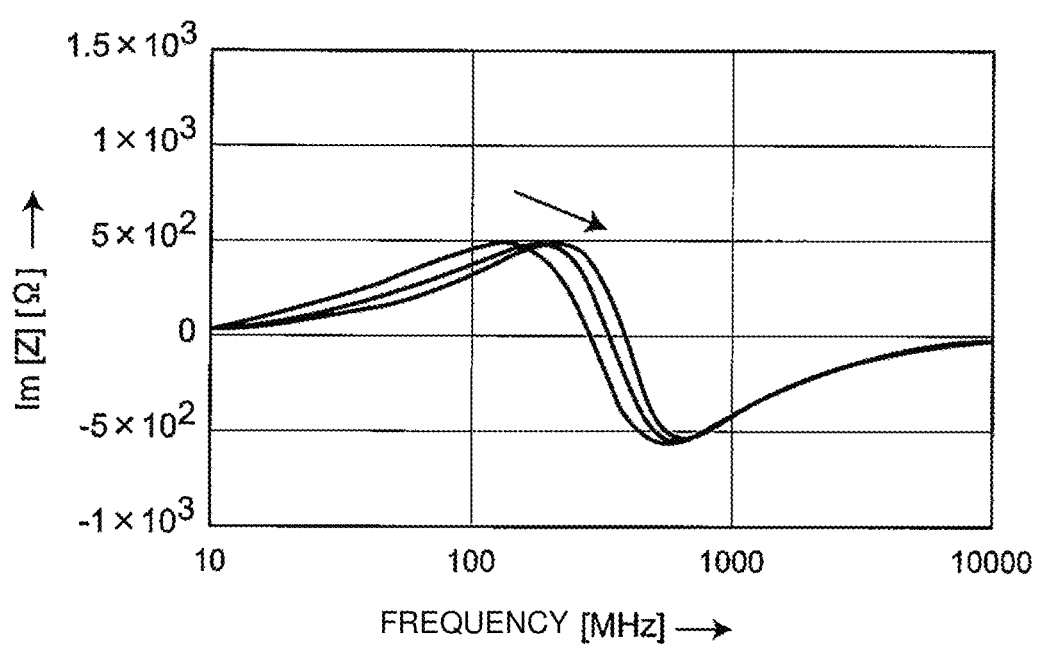
FIG. 8B is a graph illustrating an example of changes in the impedance Im[Z] of a ferrite bead when the input equilibrium value (DC current value) U is increased as U=20 mA, 30 mA, and 40 mA in example 1 as calculated using the circuit diagram in FIG. 2.

In addition, calculated values of changes in impedance that occur when the input equilibrium value (DC current value) is increased as U=20 mA, 30 mA, and 40 mA in the same circuit diagram in FIG. 2 are illustrated in FIGS. 8A and 8B. Among the DC current values in FIGS. 8A and 8B, DC current values of 20 mA and 40 mA are the DC current values at the unmeasured equilibrium points. Thus, even at the unmeasured equilibrium points, the changes in impedance due to a non-linear characteristic can be predicted and calculated.

Figure 9:
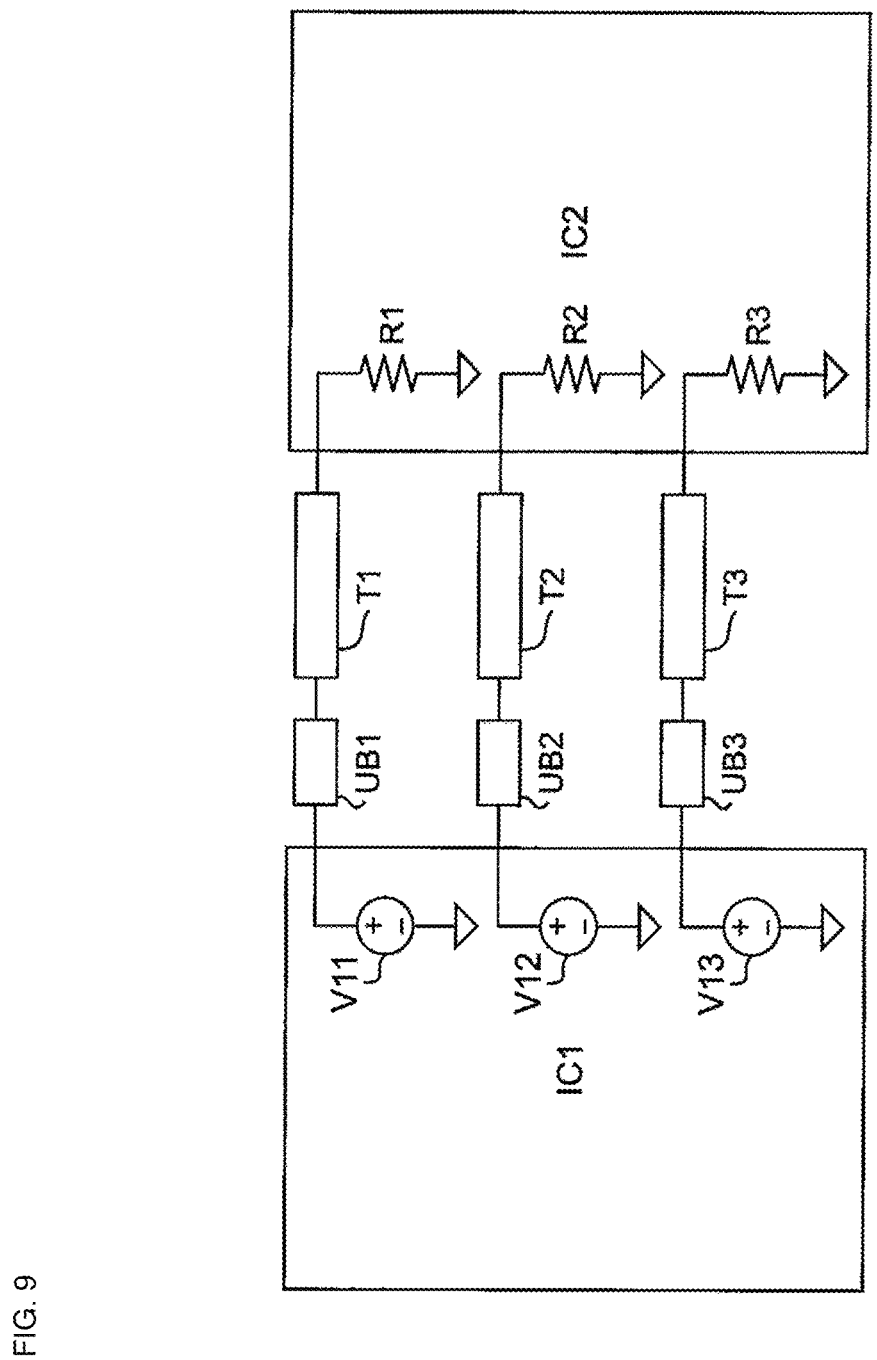
FIG. 9 is a circuit diagram of SPICE software used to calculate a non-linear characteristic such as a transient response when ferrite beads are used in communication signal lines between two integrated circuits by applying the non-linear model in example 1.

In addition, FIG. 9 illustrates a circuit diagram of SPICE software used to calculate a non-linear characteristic when ferrite beads are used as communication signal lines between two integrated circuits. In FIG. 9, two integrated circuits IC1 and IC2 are connected to each other by three transmission lines T1 to T3. In this case, V11 to V13 are arbitrary waveform voltage sources representing communication signal waveforms of time t, UB1 to UB3 are non-linear models of the same ferrite bead as in FIG. 1, and R1 to R3 are input resistances of the reception terminals. The non-linear model of a ferrite bead according to the embodiment of the present disclosure reflects a non-linearity of a ferrite bead appearing at various equilibrium points and therefore can be used to predict and calculate behavior over a wide range not only near individual equilibrium points. Therefore, various calculations, including transient responses, that reflect a non-linearity of a ferrite bead can be performed for various driving conditions and various communication signals.

In this example, a non-linear model is formed using subsystems up to the second order and accordingly the impedance measurement values were also divided as in formula (2-4) as a result of reflecting these subsystems. At this time, if the coefficient measurement values $$\{\tilde{a}_0^{(1)}(U), \tilde{a}_1^{(1)}(U), \tilde{a}_0^{(2)}(U)\}$$

are all positive, the impedance in formula (2-4) is stable.

Here, "stable" means that the rational function of formula (2-4) does not have a real positive pole. A stability condition for a rational function is generally given by Hurwitz's condition, but for a rational function having terms up to the second order, the condition is simple, "the coefficient of the denominator of the rational function is positive," and it is easy to confirm that there is no problem with a measured value. Therefore, the non-linear model of the present example can easily reflect stable measurement values and as a result the stability of the non-linear model is improved.

As described above, according to the present example, a non-linear characteristic arising from a non-linearity of a ferrite bead can be calculated without estimating the non-linear elements and structure of the ferrite bead and therefore without the need for knowledge of and insight into the ferrite bead.

Although the impedance measurement values are reflected in this example, it is clear from the above-described procedure that different responses such as admittance or an S-parameter can be reflected by changing the input and output signals as appropriate.

Similarly to ferrite beads, inductor components and coil components also have a non-linearity referred to as DC superposition, and the non-linearity is evaluated in impedance measurements at each equilibrium point (DC operating point) in the same measurement system as in FIG. 3. In this example, a ferrite bead is described as an example, but exactly the same procedure can be applied to an inductor or a coil component having a non-linearity.

In addition, although an electrical component having a non-linearity, i.e., a ferrite bead has been described as an example in the present example, the present disclosure is not limited to this example and can be applied to many other electrical and electronic components or mechanical and electromechanical components having a non-linearity for which the transfer function is expressed as a rational function and which appears as a change in the transfer function at each equilibrium point such as the impedance at individual equilibrium points.

In the above-described embodiment, measured values of impedance are reflected, but numerical calculated values such as those of the finite element method (or finite element calculation method), for example, can be reflected instead of measured values.

Example 2

Figure 10:
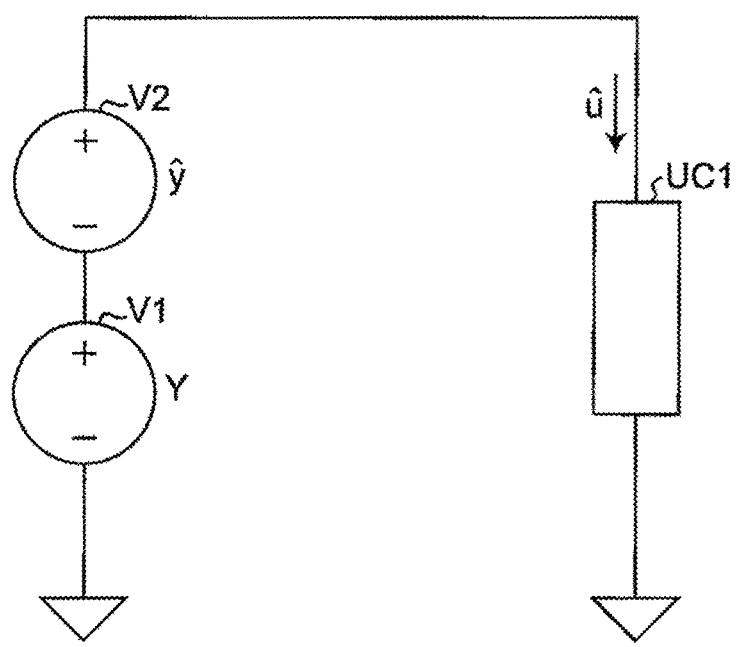
FIG. 10 is a circuit diagram of SPICE software used to calculate a non-linear characteristic of the impedance of a capacitor in example 2.

In example 2, an example in which the non-linear characteristic calculating method according to the embodiment of the present disclosure is applied to calculations performed using the SPICE software in order to predict a non-linear characteristic of a capacitor is described. FIG. 10 is a circuit diagram of SPICE software used to calculate a non-linear characteristic of the impedance of a capacitor. V1 is a DC voltage source having a voltage value Y, V2 is an AC voltage source having a variable frequency sinusoidal wave $\hat{y}$ as a voltage value, and UC1 is a non-linear model of the capacitor in the present embodiment and consists of non-linear equations obtained by changing the constant coefficients of a state space representation that are also coefficients of a transfer function into functions of one state variable. In FIG. 10, the DC voltage source V1 and the AC voltage source V2 are connected in series with each other and apply a predetermined voltage to the non-linear model UC1 of the capacitor.

For a non-linear capacitor, we consider a non-linear model formed of non-linear equations obtained by changing constant coefficients of the controllable canonical form that are also coefficients of a transfer function into functions of the state variable $x_1$, as in formulas (3-1), and letting $a_0$ be equal to 0. Here, input u and output y are the current flowing to the capacitor and the voltage between the terminals, respectively, and $x_1$ and $x_2$ are state variables expanded to the non-linear model. Time variation of behavior over a wide range can be calculated in accordance with formulas (3-1) by appropriately determining the unknown functions $a_1$, $b_0$, and $b_1$.

The equilibrium conditions for the non-linear model are given by formulas (3-2) and linear equations obtained by linearizing the non-linear model near the individual equilibrium points (DC operating points) are given by formulas (3-3). The uppercase letters represent the equilibrium values of the quantities represented by the corresponding lowercase letters. A case where an input equilibrium value (DC current value) U is 0 under an equilibrium condition corresponds to a case where there is no DC current flow and a case where an output equilibrium value (DC voltage value) Y is any arbitrary value via the state variable equilibrium value $X_1$ corresponds to a case where a DC voltage can be applied at will.

$$\begin{pmatrix} \dot{x}_1 \\ \dot{x}_2 \end{pmatrix} \begin{pmatrix} 0 & 1 \\ 0 & -a_1(x_1) \end{pmatrix} \begin{pmatrix} x_1 \\ x_2 \end{pmatrix} + \begin{pmatrix} 0 \\ 1 \end{pmatrix} u \quad (3\text{-}1a)$$

$$y = \begin{pmatrix} b_0(x_1) & b_1(x_1) \end{pmatrix} \begin{pmatrix} x_1 \\ x_2 \end{pmatrix} \quad (3\text{-}1b)$$

$$X_2 = 0 \quad (3\text{-}2a)$$

$$U = 0 \quad (3\text{-}2b)$$

$$X_1 \text{ is arbitrary} \quad (3\text{-}2c)$$

$$Y = b_0(X_1)X_1 \quad (3\text{-}2d)$$

$$\begin{pmatrix} \dot{\hat{x}}_1 \\ \dot{\hat{x}}_2 \end{pmatrix} = \begin{pmatrix} 0 & 1 \\ 0 & -a_1(X_1) \end{pmatrix} \begin{pmatrix} \hat{x}_1 \\ \hat{x}_2 \end{pmatrix} + \begin{pmatrix} 0 \\ 1 \end{pmatrix} \hat{u} \quad (3\text{-}3a)$$

$$\hat{y} = \begin{pmatrix} b_0(X_1) + b'_0(X_1)X_1 & b_1(X_1) \end{pmatrix} \begin{pmatrix} \hat{x}_1 \\ \hat{x}_2 \end{pmatrix} \quad (3\text{-}3b)$$

Hereafter, an example of a procedure used to reflect the impedance measurement values in the non-linear model in this example will be described. The impedance of the capacitor is measured at a plurality K of equilibrium points using the impedance meter 110, which is the impedance measurement system schematically represented in FIG. 11 and k sets of the coefficient measurement values $$\{\tilde{a}_1(Y_k), \tilde{b}_0(Y_k), \tilde{b}_1(Y_k)\}_{k=1,\ldots,K}$$

of formula (3-4) are obtained. Here, the kth equilibrium point is represented by an output equilibrium value $Y_k$.

Figure 11:
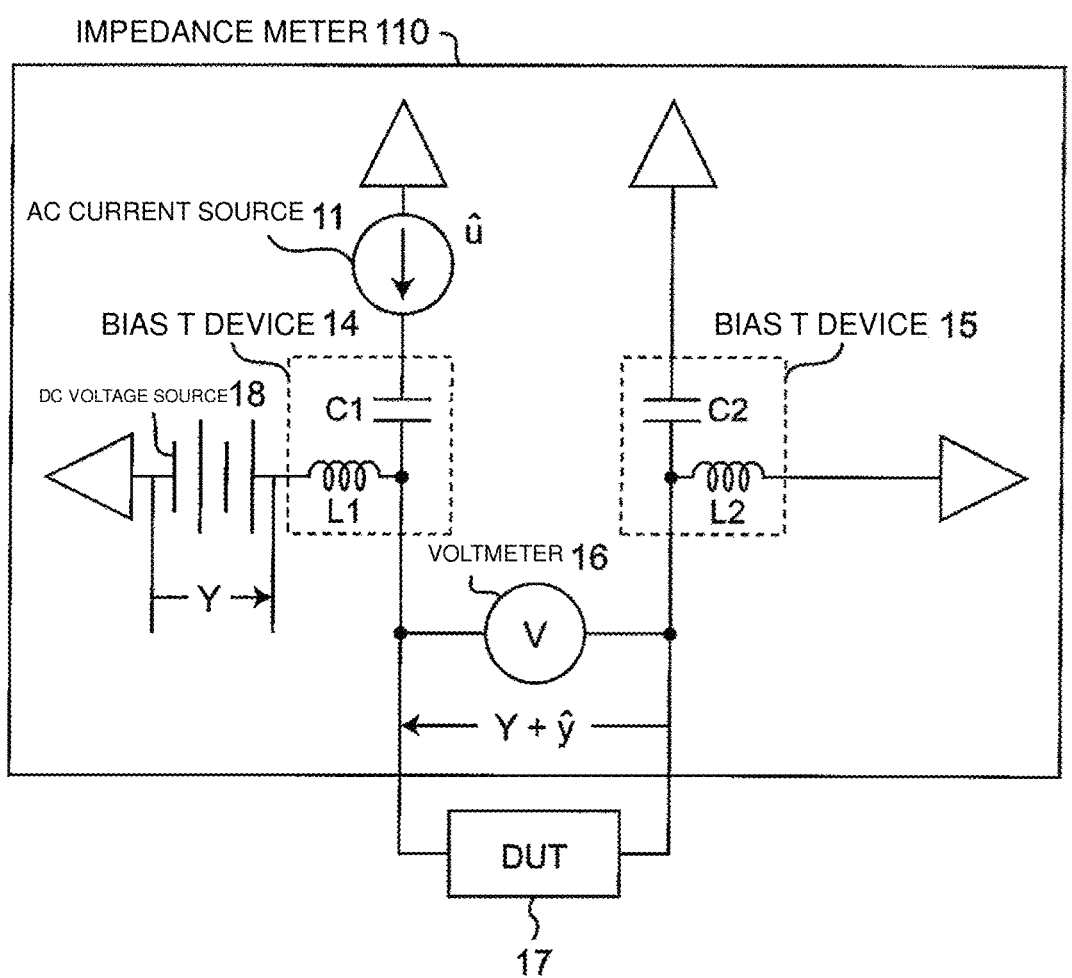
FIG. 11 is a schematic diagram of an impedance measurement system in example 2.

In FIG. 11, a to-be-measured device (DUT) 17 is connected to the impedance meter 110. The impedance meter 110 includes an AC current source 11, a DC voltage source 18, bias T devices 14 and 15, and a voltmeter 16. In this case, the bias T device 14 includes a capacitor C1 and an inductor L1 and the bias T device 15 includes a capacitor C2 and an inductor L2.

Using the above coefficients, the state space representation at each equilibrium point is expressed by formulas (3-5). There are one-to-one correspondences between the equilibrium values $X_1$ and Y at the individual equilibrium points, and therefore formula (3-6) is obtained by differentiating formula (3-2d). Therefore, the agreement conditions of formulas (3-3) and (3-5) are given by formulas (3-7). Thus, this non-linear model also has the advantage that non-linearities appearing in general impedance measurements are easily reflected.

$$\frac{\tilde{b}_1(Y)s + \tilde{b}_0(Y)}{s^2 + \tilde{a}_1(Y)s} = \frac{\tilde{b}_0(Y)/\tilde{a}_1(y)}{s} + \frac{\tilde{b}_1(Y) - \tilde{b}_0(Y)/\tilde{a}_1(Y)}{s + \tilde{a}_1(Y)} \quad (3\text{-}4)$$

-continued $$\begin{pmatrix} \dot{x}_1 \\ \dot{x}_2 \end{pmatrix} = \begin{pmatrix} 0 & 1 \\ 0 & -\tilde{a}_1(Y) \end{pmatrix} \begin{pmatrix} \hat{x}_1 \\ \hat{x}_2 \end{pmatrix} + \begin{pmatrix} 0 \\ 1 \end{pmatrix} \hat{u} \qquad (3\text{-}5a)$$

$$\hat{y} = \begin{pmatrix} \tilde{b}_0(Y) & \tilde{b}_1(Y) \end{pmatrix} \begin{pmatrix} \hat{x}_1 \\ \hat{x}_2 \end{pmatrix} \qquad (3\text{-}5b)$$

$$\frac{dY}{dX_1} = b_0(X_1) + X_1 b_0'(X_1) \qquad (3\text{-}6)$$

$$\frac{dX_1}{dY} = \frac{1}{\tilde{b}_0(Y)} \qquad (3\text{-}7a)$$

$$a_1(X_1) = \tilde{a}_1(Y) \qquad (3\text{-}7b)$$

$$b_1(X_1) = \tilde{b}_1(Y) \qquad (3\text{-}7c)$$

The function $(Y, X_1)$ is calculated from the integral of formula (3-7a) under the physical boundary condition "If the output is 0, the state variable is also 0" using $$\{\tilde{b}_0(Y_k)\}_{k=1,\ldots,K}$$

among the coefficient measurement values. Then, function $b_0(X_1)$ is calculated from formula (3-2d) and function $a_1(X_1)$ and function $b_1(X_1)$ are calculated from formula (3-7b) and formula (3-7c). Thus, the unknown functions $a_1$, $b_0$, and $b_1$ in the non-linear model represented by formulas (3-1) are calculated in the form of $(X_1, a_1(X_1), b_0(X_1), b_1(X_1))$ and a non-linearity appearing in the impedance measurement values is reflected in the non-linear model.

The non-linear model of the capacitor obtained as described above is applied to the circuit diagram in FIG. 10 and a non-linear characteristic of the impedance of the non-linear capacitor is calculated at various equilibrium points.

As described above, according to example 2, a non-linear characteristic of a capacitor can be calculated without estimating the non-linear elements and structure of the capacitor and without knowledge of and insight into the capacitor in question.

In addition, the non-linear characteristic calculating method according to the embodiment of the present disclosure can be applied not only to current-conducting electrical components such as ferrite beads and inductors, but also to non-current-conducting electrical and electronic components such as capacitors.

In this example, a non-linear model was formed using second-order non-linear equations of two state variables, however, the number of state variables may be increased to form higher-order non-linear equations or a non-linear model may be constructed from subsystems, depending on the characteristics of the capacitor in question.

Example 3

In example 3, an example in which the non-linear characteristic calculating method according to the embodiment of the present disclosure is applied to calculations performed using the SPICE software in order to predict a non-linear characteristic of a ferrite bead is described. The circuit diagram of the SPICE software used to calculate the non-linear characteristic of the impedance of the ferrite bead is illustrated in FIG. 2, and is the same as in example 1 except for UB1 being the non-linear model in this example. The non-linear model UB1 is formed of non-linear equations obtained by changing constant coefficients in a state space representation that are also coefficients of a transfer function into functions of one state variable.

For a ferrite bead, we will consider a non-linear model formed of non-linear equations obtained by replacing constant coefficients of an observable canonical form representation that are also coefficients of a transfer function with functions of a state variable $x_2$ as in formulas (4-1). Here, input u and output y are the current flowing to the ferrite bead and the voltage between the terminals, respectively, and $x_1$ and $x_2$ are state variables expanded to the non-linear model. In addition, $h_0$ is a constant. Time variation of behavior over a wide range can be calculated in accordance with formulas (4-1) by appropriately determining the unknown functions $a_0$, $a_1$, $b_0$, and $b_1$.

The equilibrium conditions for the non-linear model are given by formulas (4-2) and linear equations obtained by linearizing the non-linear model near the individual equilibrium points (DC operating points) are given by formulas (4-3). The uppercase letters represent the equilibrium values of the quantities represented by the corresponding lowercase letters.

$$\begin{pmatrix} \dot{x}_1 \\ \dot{x}_2 \end{pmatrix} = \begin{pmatrix} 0 & -a_0(x_2) \\ 1 & -a_1(x_2) \end{pmatrix} \begin{pmatrix} x_1 \\ x_2 \end{pmatrix} + \begin{pmatrix} b_0(x_2) \\ b_1(x_2) \end{pmatrix} u \qquad (4\text{-}1a)$$

$$y = \begin{pmatrix} 0 & 1 \end{pmatrix} \begin{pmatrix} x_1 \\ x_2 \end{pmatrix} + h_0 u \qquad (4\text{-}1b)$$

$$a_0(X_2)X_2 = b_0(X_2)U \qquad (4\text{-}2a)$$

$$a_1(X_2)X_2 = X_1 + b_1(X_2)U \qquad (4\text{-}2b)$$

$$Y = X_2 + h_0 U \qquad (4\text{-}2c)$$

$$\begin{pmatrix} \dot{\hat{x}}_1 \\ \dot{\hat{x}}_2 \end{pmatrix} = \begin{pmatrix} 0 & -b_0(X_2)\frac{dU}{dX_2} \\ 1 & -\frac{dX_1}{dX_2} - b_1(X_2)\frac{dU}{dX_2} \end{pmatrix} \begin{pmatrix} \hat{x}_1 \\ \hat{x}_2 \end{pmatrix} + \begin{pmatrix} b_0(X_2) \\ b_1(X_2) \end{pmatrix} \hat{u} \qquad (4\text{-}3a)$$

$$\hat{y} = \begin{pmatrix} 0 & 1 \end{pmatrix} \begin{pmatrix} \hat{x}_1 \\ \hat{x}_2 \end{pmatrix} + h_0 \hat{u} \qquad (4\text{-}3b)$$

Hereafter, an example of a procedure used to reflect the impedance measurement values in the non-linear model in this example will be described. The impedance of the ferrite bead is measured at a plurality K of equilibrium points using the impedance measurement system schematically represented in FIG. 3 and K sets of coefficient measurement values $$\{\tilde{a}_0(U_k), \tilde{a}_1(U_k), \tilde{b}_0(U_k), \tilde{b}_1(U_k)\}_{k=1,\ldots,K}$$

of formula (4-4) are obtained. Here, the kth equilibrium point is represented by an input equilibrium value $U_k$. Using these coefficients, the state space representation at each equilibrium point is expressed by formulas (4-5). Therefore, the agreement conditions between formulas (4-3) and (4-5) are given by formulas (4-6). In addition, formula (4-7) is obtained from formulas (4-6). Thus, this non-linear model also has the advantage that non-linearities appearing in general impedance measurements are easily reflected.

$$\frac{\tilde{b}_1(U)s + \tilde{b}_0(U)}{s^2 + \tilde{a}_1(U)s + \tilde{a}_0(U)} + \tilde{h}_0 \qquad (4\text{-}4)$$

$$\begin{pmatrix} \dot{\hat{x}}_1 \\ \dot{\hat{x}}_2 \end{pmatrix} = \begin{pmatrix} 0 & -\tilde{a}_0(U) \\ 1 & -\tilde{a}_1(U) \end{pmatrix} \begin{pmatrix} \hat{x}_1 \\ \hat{x}_2 \end{pmatrix} + \begin{pmatrix} \tilde{b}_0(U) \\ \tilde{b}_1(U) \end{pmatrix} \hat{u} \qquad (4\text{-}5a)$$

$$\hat{y} = \begin{pmatrix} 0 & 1 \end{pmatrix} \begin{pmatrix} \hat{x}_1 \\ \hat{x}_2 \end{pmatrix} + \tilde{h}_0 \hat{u} \qquad (4\text{-}5b)$$

-continued $$b_0(X_2)\frac{dU}{dX_2} = \tilde{a}_0(U) \tag{4-6a}$$

$$\frac{dX_1}{dX_2} + b_1(X_2)\frac{dU}{dX_2} = \tilde{a}_1(U) \tag{4-6b}$$

$$b_0(X_2) = \tilde{b}_0(U) \tag{4-6c}$$

$$b_1(X_2) = \tilde{b}_1(U) \tag{4-6d}$$

$$h_0 = \tilde{h}_0 \tag{4-6e}$$

$$\frac{dX_2}{dU} = \frac{\tilde{b}_0(U)}{\tilde{a}_0(U)} \tag{4-7a}$$

$$\frac{dX_1}{dU} = \frac{\tilde{a}_1(U)\tilde{b}_0(U)}{\tilde{a}_0(U)} - \tilde{b}_1(U) \tag{4-7b}$$

Function $(U, X_1)$ and function $(U, X_2)$ are calculated from the integrals of formulas (4-7) under the physical boundary condition "If the input is 0, the state variable is also 0" using the coefficient measurement values. Then, function $b_0(X_2)$ and function $b_1(X_2)$ are calculated from formula (4-6c) and formula (4-6d). In addition, function $a_0(X_2)$ and function $a_1(X_2)$ are calculated from function $b_0$ and function $b_1$ and formula (4-2a) and formula (4-2b). Thus, the unknown functions $a_0$, $a_1$, $b_0$, and $b_1$ in the non-linear model represented by formulas (4-1) are calculated in the form of $(X_2, a_0(X_2), a_1(X_2), b_0(X_2), b_1(X_2))$ and a non-linearity appearing in the impedance measurement values is reflected in the non-linear model. The constant $h_0$ is calculated using formula (4-7e).

The non-linear model of the ferrite bead obtained as described above is applied to the circuit diagram in FIG. 2 in order to calculate the impedance of the non-linear ferrite bead at various equilibrium points.

As described above, according to example 3, a non-linear characteristic of a ferrite bead can be calculated without estimating the non-linear elements and structure of the ferrite bead and without knowledge of and insight into the ferrite bead in question.

In addition, not limited to the controllable canonical form, another state space representation can also be expanded to the non-linear model.

In this example, a non-linear model was formed using second-order non-linear equations of two state variables, however, the number of state variables may be increased to form higher-order non-linear equations or a non-linear model may be constructed from subsystems, depending on the characteristics of the ferrite bead in question.

Example 4

Figure 12:
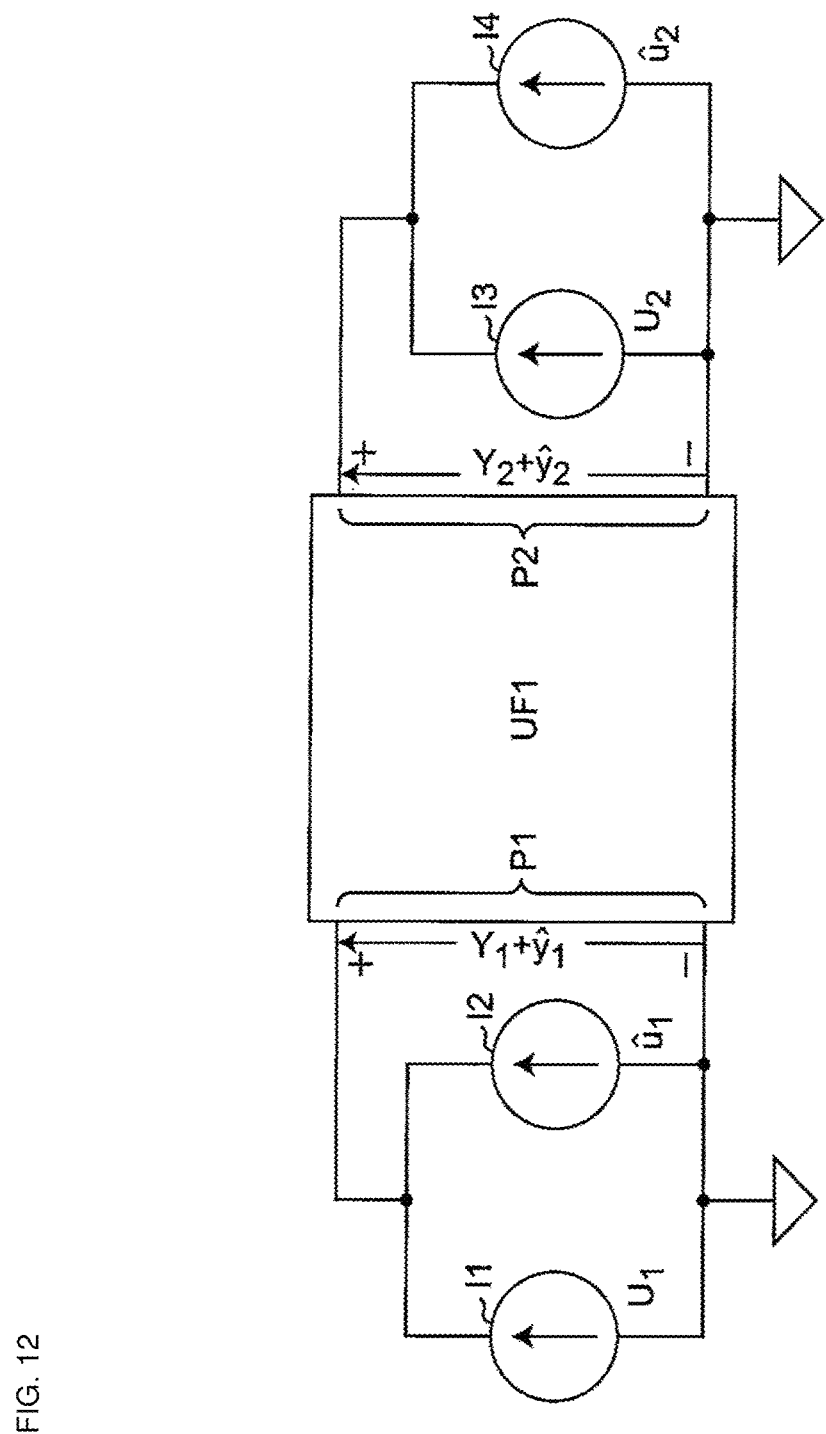
FIG. 12 is a circuit diagram of SPICE software used to calculate a non-linear characteristic of the impedance of a filter component in example 4.

In example 4, an example in which the non-linear characteristic calculating method according to the embodiment of the present disclosure is applied to calculations performed using the SPICE software in order to predict a non-linear characteristic of a two-port filter component is described. FIG. 12 is a circuit diagram of SPICE software used to calculate a non-linear characteristic of the impedance of the filter component. In FIG. 12, I1 and I3 are DC current sources having current values $U_1$ and $U_2$, respectively, and I2 and I4 are AC current sources having variable frequency sine wave $\hat{u}_1$ and $\hat{u}_2$ as current values, UF1 is a non-linear model of a two-port filter component having two ports P1 and P2 in this embodiment and is formed of non-linear equations obtained by changing constant coefficients of a state space representation that are also coefficients of a transfer function into functions of one state variable. In FIG. 12, the DC current source I1 and the AC current source I2 are connected in parallel with each other and supply a prescribed current to the port P1 of the non-linear model UF1 of the filter component. In addition, the DC current source I3 and the AC current source I4 are connected in parallel with each other and supply a prescribed current to the port P2 of the non-linear model UF1 of the filter component. The AC current sources I2 and I4 each supply a small amplitude current and a zero amplitude current in an alternating manner and the impedance is calculated.

For the two-port filter, we will consider a non-linear model formed of non-linear equations obtained by replacing constant coefficients of a controllable canonical form representation that are also coefficients of a transfer function with functions of state variables $x_1$ and $x_3$ as in formulas (5-1). Here, inputs $u_1$ and $u_2$ and outputs $y_1$ and $y_2$ are the currents flowing to the ports of the filter and the generated voltages, respectively, and $x_1$ to $x_4$ are state variables expanded to the non-linear model. Time variation of behavior over a wide range can be calculated in accordance with formulas (5-1) by appropriately determining the unknown functions $a_0^{(1)}$, $a_1^{(1)}$, $a_0^{(2)}$, $a_1^{(2)}$, $b_0^{(11)}$, $b_1^{(11)}$, $b_0^{(12)}$, $b_1^{(12)}$, $b_0^{(21)}$, $b_1^{(21)}$, $b_0^{(22)}$, and $b_1^{(22)}$.

The equilibrium conditions for the non-linear model are given by formulas (5-2) and linear equations obtained by linearizing the non-linear model near the individual equilibrium points (DC operating points) are given by formulas (5-3). The uppercase letters represent the equilibrium values of the quantities represented by the corresponding lowercase letters.

$$\begin{pmatrix} \dot{x}_1 \\ \dot{x}_2 \\ \dot{x}_3 \\ \dot{x}_4 \end{pmatrix} = \tag{5-1a}$$

$$\begin{pmatrix} 0 & 1 & 0 & 0 \\ -a_0^{(1)}(x_1) & -a_1^{(1)}(x_1) & 0 & 0 \\ 0 & 0 & 0 & 1 \\ 0 & 0 & -a_0^{(2)}(x_3) & -a_1^{(2)}(x_3) \end{pmatrix} \begin{pmatrix} x_1 \\ x_2 \\ x_3 \\ x_4 \end{pmatrix} + \begin{pmatrix} 0 & 0 \\ 1 & 0 \\ 0 & 0 \\ 0 & 1 \end{pmatrix} \begin{pmatrix} u_1 \\ u_2 \end{pmatrix}$$

$$\begin{pmatrix} y_1 \\ y_2 \end{pmatrix} = \begin{pmatrix} b_0^{(11)}(x_1) & b_1^{(11)}(x_1) & b_0^{(12)}(x_3) & b_1^{(12)}(x_3) \\ b_0^{(21)}(x_1) & b_1^{(21)}(x_1) & b_0^{(22)}(x_3) & b_1^{(22)}(x_3) \end{pmatrix} \begin{pmatrix} x_1 \\ x_2 \\ x_3 \\ x_4 \end{pmatrix} \tag{5-1b}$$

$$X_2 = X_4 = 0 \tag{5-2a}$$

$U_1$ and $U_2$ are arbitrary $\tag{5-2b}$ $$a_0^{(1)}(X_1)X_1 = U_1 \tag{5-2c}$$

$$a_0^{(2)}(X_3)X_3 = U_2 \tag{5-2d}$$

$$Y_1 = b_0^{(11)}(X_1)X_1 + b_0^{(12)}(X_3)X_3 \tag{5-2e}$$

$$Y_2 = b_0^{(21)}(X_1)X_1 + b_0^{(22)}(X_3)X_3 \tag{5-2f}$$

$$\begin{pmatrix} \dot{x}_1 \\ \dot{x}_2 \\ \dot{x}_3 \\ \dot{x}_4 \end{pmatrix} = \tag{5-3a}$$

$$\begin{pmatrix} 0 & 1 & 0 & 0 \\ -\begin{pmatrix} a_0^{(1)}(X_1) + \\ X_1 a_0^{(1)'}(X_1) \end{pmatrix} & -a_1^{(1)}(X_1) & 0 & 0 \\ 0 & 0 & 0 & 1 \\ 0 & 0 & -\begin{pmatrix} a_0^{(2)}(X_3) + \\ X_3 a_0^{(2)'}(X_3) \end{pmatrix} & -a_1^{(2)}(X_3) \end{pmatrix} \begin{pmatrix} \hat{x}_1 \\ \hat{x}_2 \\ \hat{x}_3 \\ \hat{x}_4 \end{pmatrix} +$$

$$\begin{pmatrix} 0 & 0 \\ 1 & 0 \\ 0 & 0 \\ 0 & 1 \end{pmatrix} \begin{pmatrix} \hat{u}_1 \\ \hat{u}_2 \end{pmatrix}$$

$$\begin{pmatrix} \hat{y}_1 \\ \hat{y}_2 \end{pmatrix} = \begin{pmatrix} b_0^{(11)}(X_1) + & b_1^{(11)}(X_1) & b_0^{(12)}(X_3) + & b_1^{(12)}(X_3) \\ X_1 b_0^{(11)'}(X_1) & & X_3 b_0^{(12)'}(X_3) & \\ b_0^{(21)}(X_1) + & b_1^{(21)}(X_1) & b_0^{(22)}(X_3) + & b_1^{(22)}(X_3) \\ X_1 b_0^{(21)'}(X_1) & & X_3 b_0^{(22)'}(X_3) & \end{pmatrix} \begin{pmatrix} \hat{x}_1 \\ \hat{x}_2 \\ \hat{x}_3 \\ \hat{x}_4 \end{pmatrix} \quad (5\text{-}3b)$$

Hereafter, an example of a procedure used to reflect the impedance measurement values in the non-linear model in this example will be described. An impedance matrix of the two-port filter is measured at a plurality K of equilibrium points by a two-port measurement system, which is an extension of the impedance measurement system schematically represented in FIG. 3, in order to obtain k sets of the coefficient measurement values $$\{\tilde{a}_0^{(1)}(U_{1,k}), \tilde{a}_1^{(1)}(U_{1,k}), \tilde{b}_0^{(11)}(U_{1,k}), \tilde{b}_1^{(11)}(U_{1,k}), \tilde{b}_0^{(21)}(U_{1,k}), \tilde{b}_1^{(21)}(U_{1,k})\}_{k=1,\ldots,K}$$

and $$\{\tilde{a}_0^{(2)}(U_{2,k}), \tilde{a}_1^{(2)}(U_{2,k}), \tilde{b}_0^{(12)}(U_{2,k}), \tilde{b}_1^{(12)}(U_{2,k}), \tilde{b}_0^{(22)}(U_{2,k}), \tilde{b}_1^{(22)}(U_{2,k})\}_{k=1,\ldots,K}$$

of formulas (5-4). Here, the kth equilibrium point is represented by two input equilibrium values $U_{1,k}$ and $U_{2,k}$. Using these coefficients, the state space representation at each equilibrium point is expressed by formulas (5-5). Using the differentials of formula (5-2c) and formula (5-2d) etc., the agreement conditions for formulas (5-3) and formulas (5-5) are given by formulas (5-6). Thus, this non-linear model also has the advantage that non-linearities appearing in general impedance measurements are easily reflected.

$$\begin{pmatrix} \dfrac{\tilde{b}_1^{(11)}(U_1)s + \tilde{b}_0^{(11)}(U_1)}{s^2 + \tilde{a}_1^{(1)}(U_1)s + \tilde{a}_0^{(1)}(U_1)} & \dfrac{\tilde{b}_1^{(12)}(U_2)s + \tilde{b}_0^{(12)}(U_2)}{s^2 + \tilde{a}_1^{(2)}(U_2)s + \tilde{a}_0^{(2)}(U_2)} \\ \dfrac{\tilde{b}_1^{(21)}(U_1)s + \tilde{b}_0^{(21)}(U_1)}{s^2 + \tilde{a}_1^{(1)}(U_1)s + \tilde{a}_0^{(1)}(U_1)} & \dfrac{\tilde{b}_1^{(22)}(U_2)s + \tilde{b}_0^{(22)}(U_2)}{s^2 + \tilde{a}_1^{(2)}(U_2)s + \tilde{a}_0^{(2)}(U_2)} \end{pmatrix} \quad (5\text{-}4)$$

$$\begin{pmatrix} \dot{\hat{x}}_1 \\ \dot{\hat{x}}_2 \\ \dot{\hat{x}}_3 \\ \dot{\hat{x}}_4 \end{pmatrix} = \quad (5\text{-}5a)$$

$$\begin{pmatrix} 0 & 1 & 0 & 0 \\ -\tilde{a}_0^{(1)}(U_1) & -\tilde{a}_1^{(1)}(U_1) & 0 & 0 \\ 0 & 0 & 0 & 1 \\ 0 & 0 & -\tilde{a}_0^{(2)}(U_2) & -\tilde{a}_1^{(2)}(U_2) \end{pmatrix} \begin{pmatrix} \hat{x}_1 \\ \hat{x}_2 \\ \hat{x}_3 \\ \hat{x}_4 \end{pmatrix} + \begin{pmatrix} 0 & 0 \\ 1 & 0 \\ 0 & 0 \\ 0 & 1 \end{pmatrix} \begin{pmatrix} \hat{u}_1 \\ \hat{u}_2 \end{pmatrix}$$

$$\begin{pmatrix} \hat{y}_1 \\ \hat{y}_2 \end{pmatrix} = \begin{pmatrix} \tilde{b}_0^{(11)}(U_1) & \tilde{b}_1^{(11)}(U_1) & \tilde{b}_0^{(12)}(U_2) & \tilde{b}_1^{(12)}(U_2) \\ \tilde{b}_0^{(21)}(U_1) & \tilde{b}_1^{(21)}(U_1) & \tilde{b}_0^{(22)}(U_2) & \tilde{b}_1^{(22)}(U_2) \end{pmatrix} \begin{pmatrix} \hat{x}_1 \\ \hat{x}_2 \\ \hat{x}_3 \\ \hat{x}_4 \end{pmatrix} \quad (5\text{-}5b)$$

$$\dfrac{dU_1}{dX_1} = a_0^{(1)}(X_1) + X_1 a_0^{(1)'}(X_1) = \tilde{a}_0^{(1)}(U_1) \quad (5\text{-}6a)$$

$$\dfrac{dU_2}{dX_3} = a_0^{(2)}(X_3) + X_3 a_0^{(2)'}(X_3) = \tilde{a}_0^{(2)}(U_2) \quad (5\text{-}6b)$$

$$a_1^{(1)}(X_1) = \tilde{a}_1^{(1)}(U_1) \quad (5\text{-}6c)$$

$$a_1^{(2)}(X_3) = \tilde{a}_1^{(2)}(U_2) \quad (5\text{-}6d)$$

$$\dfrac{d}{dX_1}(X_1 b_0^{(11)}(X_1)) = b_0^{(11)}(X_1) + X_1 b_0^{(11)'}(X_1) = \tilde{b}_0^{(11)}(U_1) \quad (5\text{-}6e)$$

$$b_1^{(11)}(X_1) = \tilde{b}_1^{(11)}(U_1) \quad (5\text{-}6f)$$

$$\dfrac{d}{dX_1}(X_1 b_0^{(21)}(X_1)) = b_0^{(21)}(X_1) + X_1 b_0^{(21)'}(X_1) = \tilde{b}_0^{(21)}(U_1) \quad (5\text{-}6g)$$

$$b_1^{(21)}(X_1) = \tilde{b}_1^{(21)}(U_1) \quad (5\text{-}6h)$$

$$\dfrac{d}{dX_3}(X_3 b_0^{(12)}(X_3)) = b_0^{(12)}(X_3) + X_1 b_0^{(12)'}(X_3) = \tilde{b}_0^{(12)}(U_2) \quad (5\text{-}6i)$$

$$b_1^{(12)}(X_3) = \tilde{b}_1^{(12)}(U_2) \quad (5\text{-}6j)$$

$$\dfrac{d}{dX_3}(X_3 b_0^{(22)}(X_3)) = b_0^{(22)}(X_3) + X_1 b_0^{(22)'}(X_3) = \tilde{b}_0^{(22)}(U_2) \quad (5\text{-}6k)$$

$$b_1^{(22)}(X_3) = \tilde{b}_1^{(22)}(U_2) \quad (5\text{-}6l)$$

Function $(U_1, X_1)$ and function $(U_2, X_3)$ are calculated from the integrals of formula (5-6a) and formula (5-6b) under the physical boundary condition "If the input is 0, the state variable is also 0" using the coefficient measurement values. Function $$a_0^{(1)}(X_1)$$

and function $$a_0^{(3)}(X_3)$$

are calculated using formula (5-2c) and formula (5-2d).
In addition, function $$a_1^{(1)}(X_1)$$

and function $$a_1^{(2)}(X_3)$$

are calculated using formula (5-6c) and formula (5-6d).
In addition, formulas (5-6e) to (5-6l) and the above-obtained function $(U_1, X_1)$ and function $(U_2, X_3)$ are combined with each other and functions $b_0^{(11)}$, $b_0^{(12)}$, $b_0^{(21)}$ and $b_0^{(22)}$ are integrated, and then function $$b_0^{(11)}(X_1),$$

function $$b_1^{(11)}(X_1),$$

function $$b_0^{(21)}(X_1),$$

function $$b_1^{(21)}(X_1),$$

function $$b_0^{(22)}(X_3),$$

function $b_1^{(22)}(X_3)$, function $b_0^{(12)}(X_3)$ and function $b_1^{(12)}(X_3)$, are calculated.

Thus, the unknown functions $a_0^{(1)}$, $a_0^{(2)}$, $a_0^{(2)}$, $a_1^{(2)}$, $b_0^{(11)}$, $b_1^{(11)}$, $b_0^{(12)}$, $b_1^{(12)}$, $b_0^{(21)}$, $b_1^{(21)}$, $b_0^{(22)}$, and $b_1^{(22)}$ in the non-linear model represented by formulas (5-1) are calculated in the form of functions $(X_1, a_0^{(1)}(X_1), a_1^{(1)}(X_1), b_0^{(11)}(X_1), b_1^{(11)}(X_1), b_0^{(21)}(X_1), b_1^{(21)}(X_1))$ and $(X_3, a_0^{(2)}(X_3), a_1^{(2)}(X_3), b_0^{(12)}(X_3), b_1^{(12)}(X_3), b_0^{(22)}(X_3), b_1^{(22)}(X_3))$ to reflect a non-linearity that appears in the impedance measurement values.

The non-linear model of the two-port filter component obtained as described above is applied to the circuit diagram in FIG. 12 and the impedance of the non-linear two-port filter component at various equilibrium points is calculated.

As described above, according to example 4, a non-linear characteristic of a filter component can be calculated without estimating the non-linear elements and structure of the filter component and without knowledge of and insight into the filter component in question.

In this example, a non-linear model was formed using two second-order subsystems, however, the number of state variables may be increased to form higher-order non-linear equations or each subsystem may be further formed of subsystems depending on the characteristics of the filter in question.

In example 4, calculation of a non-linear characteristic of a two-port component has been described, but embodiments of the present disclosure are not limited to this example and may instead be applied to calculation of a non-linear characteristic of a multi-port non-linear device having three or more ports.

If formula (5-7) or (5-8) is combined with formula (5-1a) instead of formula (5-1b), a two-input one-output or two-input three-output non-linear model can be formed. Thus, not limited to multi-port components, embodiments of the present disclosure are generally applicable to multi-input and multi-output transfer functions.

$$y_1 = \begin{pmatrix} b_0^{(11)}(x_1) & b_1^{(11)}(x_1) & b_0^{(12)}(x_3) & b_1^{(12)}(x_3) \end{pmatrix} \begin{pmatrix} x_1 \\ x_2 \\ x_3 \\ x_4 \end{pmatrix} \quad (5\text{-}7)$$

$$\begin{pmatrix} y_1 \\ y_2 \\ y_3 \end{pmatrix} = \begin{pmatrix} b_0^{(11)}(x_1) & b_1^{(11)}(x_1) & b_0^{(12)}(x_3) & b_1^{(12)}(x_3) \\ b_0^{(21)}(x_1) & b_1^{(21)}(x_1) & b_0^{(22)}(x_3) & b_1^{(22)}(x_3) \\ b_0^{(31)}(x_1) & b_1^{(31)}(x_1) & b_0^{(32)}(x_3) & b_1^{(32)}(x_3) \end{pmatrix} \begin{pmatrix} x_1 \\ x_2 \\ x_3 \\ x_4 \end{pmatrix} \quad (5\text{-}8)$$

A non-linear device such as the filter component of this example or a multi-port component to which the non-linear characteristic calculating method has been applied may be a non-linear device such as a noise filter or EMI rejection filter, such as a noise filter or EMI rejection filter including a coil, other than an electrical filter.

Embodiment 2

An embodiment in which the non-linear characteristic calculating method according to the embodiment of the present disclosure is applied to a computer program will be described. FIG. 14 is a flowchart illustrating non-linear characteristic calculation processing executed by a computer 20 schematically illustrated in FIG. 13.

Figure 13:
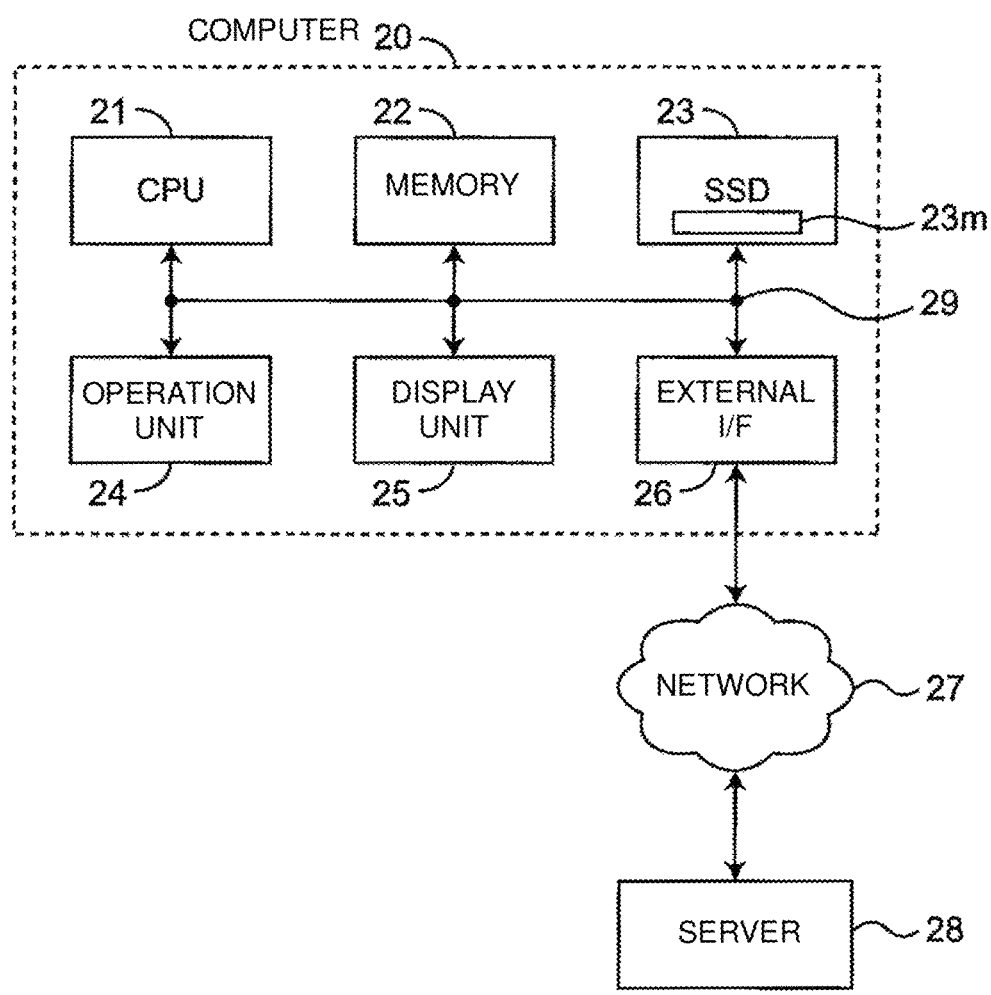
FIG. 13 is a schematic diagram of a computer that executes a computer program of embodiment 2.
Figure 14:
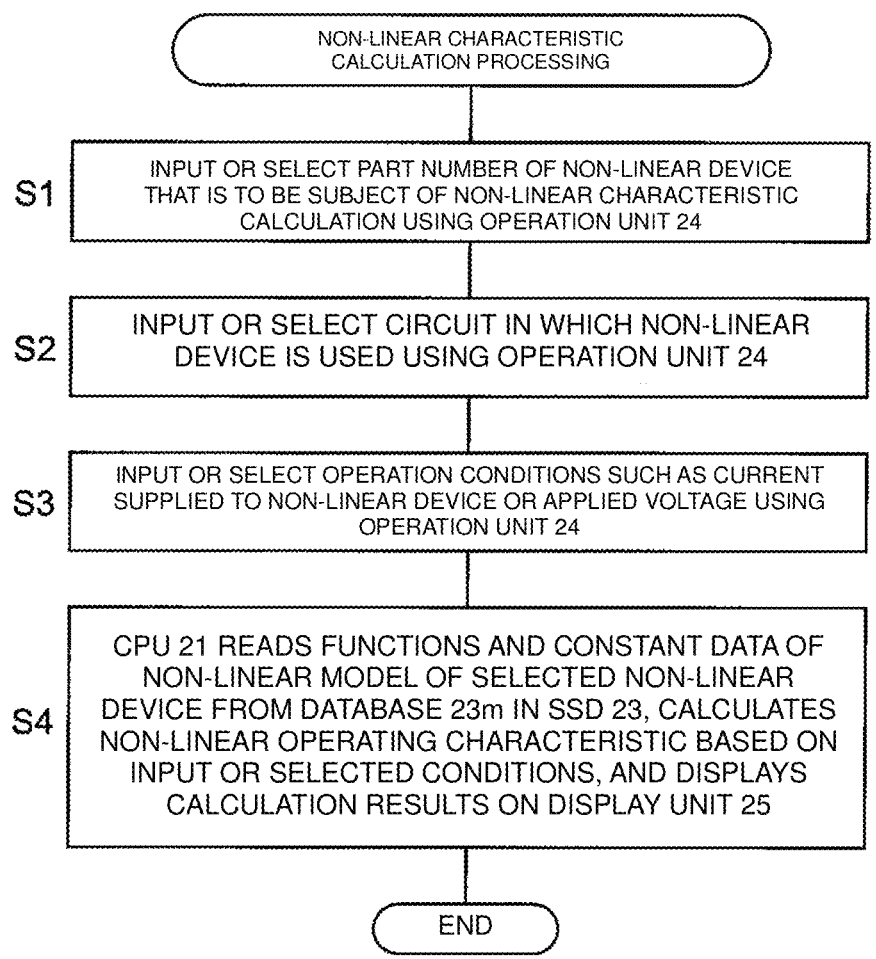
FIG. 14 is a flowchart of the computer program of embodiment 2.

In FIG. 13, the computer 20 is for example a digital computer and is configured to include a central processing unit (CPU) 21, a memory 22, a solid state drive (SSD) 23, an operation unit 24, a display unit 25, and an external interface (external I/F) 26 and the processing units 21 to 26 are connected to each other by a bus 29. The external interface 26 is connected to a server 28 by a network 27 such as the Internet.

The CPU 21 controls the operation of each of the processing units 21 to 26 of the computer 20 to perform the non-linear characteristic calculation processing in FIG. 14. The memory 22 is a main memory for execution of processing by the CPU 21, and the SSD 23 stores, for example, the basic software (OS) of the computer 20, the program of the non-linear characteristic calculation processing in FIG. 14, and programs or data necessary for executing the program of the non-linear characteristic calculation processing in FIG. 14. The operation unit 24 consists of, for example, a keyboard and a mouse, and is provided for inputting instruction data or execution data for executing the non-linear characteristic calculation processing. The display unit 25 displays calculation results calculated by the non-linear characteristic calculation processing and so forth. A program of the non-linear characteristic calculation processing may be stored in a recording medium of the SSD 23 or may be stored on an optical disc such as a CD, CD-R, DVD, DVD-R, BD, BD-R, or the like and loaded into the SSD 23 via an optical disc drive.

The non-linear characteristic calculating method for calculating a non-linear characteristic of a non-linear device according to the embodiment of the present disclosure can be easily used by using this computer program. As illustrated in FIG. 14, this computer program includes a first step S1, a second step S2, a third step S3, and a fourth step S4.

In FIG. 14, in the first step S1, the part number of a non-linear device, which is to be the subject of the non-linear characteristic calculation, is input or selected. In the second step S2, the circuit in which the non-linear device is used such as FIG. 2 or FIG. 9 is input or selected. In the third step S3, the operation conditions such as a current supplied to the non-linear device or an applied voltage are input or selected. In the fourth step S4, function and constant data of a non-linear model of any embodiment of the selected non-linear device is read out from a database, and a non-linear operation characteristic is calculated on the basis of the conditions input or selected in the third step S3 and the calculation results are displayed on a screen or the like. The computer program executes calculation of a non-linear characteristic of the non-linear device of any of the above embodiments while functioning as the non-linear model of the non-linear device of any of the above embodiments by performing the arithmetic processing of executing each of these steps S1 to S4.

According to this embodiment, a user of the computer program can obtain the results of calculation of a non-linear characteristic of a non-linear device with minimal input of information and can easily provide characteristic values and predicted values taking into account non-linear effects. Component selection by the user of the computer program is simplified.

In addition, the above-described computer program may output a file, such as a SPICE netlist or VHDL-AMS of the selected non-linear device via the external interface 26. As a result, secondary use of non-linear models of non-linear devices in different computer programs or software is possible.

It is possible to share the calculation results by storing the computer program on the recording medium of a portable personal computer (portable PC). In addition, the calculation function can be distributed or provided via the network 27 to an unspecified number of users by storing the computer program on a recording medium of the server 28 connected to the network 27, such as the Internet, and allowing it to be downloaded or executed on the server 28.

Modifications

It goes without saying that the embodiments in this specification are only examples and parts of the configurations illustrated in different embodiments may be substituted for each other or combined with each other. Description of matters common to embodiment 1 is omitted from embodiment 2 and the description of embodiment 2 focuses on the parts that are different and, in particular, operational effects resulting from the same configurations are not described again in embodiment 2.

Although the present disclosure has been sufficiently described in relation to preferred embodiments while referring to the accompanying drawings, various modifications and behaviors will be evident to people skilled in the art. So long as such modifications and amendments do not depart from the scope of present disclosure as defined by the appended claims, such modifications and amendments are to be understood as being included in the scope of the present disclosure.

As described in detail above, according to the non-linear characteristic calculating method and so forth of the embodiments of the present disclosure, it is possible to calculate a non-linear characteristic of a non-linear device for a wide range of non-linearities possessed by a non-linear device without estimating the non-linear elements and structure of the non-linear device in contrast to the related art.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A non-linear characteristic calculating method to be executed by a computer, for calculating a non-linear characteristic of a non-linear device,
    the computer including a processor and an external interface, and
    the method comprising:
        calculating, by the processor, the non-linear characteristic of the non-linear device based on a non-linear model comprising non-linear equations obtained by replacing constant coefficients of a linear state space representation that are also coefficients of a transfer function with functions of one state variable, and
        outputting, via the external interface, a result of the non-linear characteristic,
    wherein the one state variable indicates an internal state of the non-linear device,
    wherein, when the non-linear equations are described in the state space representation which includes a matrix, a vector composed of state variables, an input, and an output, the vector indicates an internal state of the non-linear device and is distinct from the input, and the one state variable is a component of the vector,
    wherein the calculating the non-linear characteristic calculates linear responses at bias points and transient responses of the non-linear device,
    the one state variable is one of the state variables of non-linear state space representations as the non-linear model, and
    the non-linear device is an electrical component,
    wherein the method further comprises making, by the processor, the non-linear model with the functions fit linear responses at the bias points, by measuring impedance values at the bias points and providing the measured impedance values for use in modeling at the bias points, and identifying the functions relevant to the non-linear equations concerning the one state variable,
    wherein the non-linear equations are described by the non-linear state space representations, in which:
        the state variables are numbered,
        one of the state variables with the first number is defined as the one state variable,
        a time derivative of each of the state variables, except for one of the state variables with the last number, is equal to one of the state variables with a next number,
        the time derivative of one of the state variables with the last number is equal to a sum of the input and a linear combination, the linear combination being calculated as inner product of a row vector and a column vector, respective elements of the row vector being first functions of the one state variable taken with a negative sign, and respective elements of the column vector being all of the state variables, and
        the output is equal to a sum of:
            a linear combination, the linear combination being calculated as inner product of another row vector and the column vector, respective elements of the another row vector being second functions of the one state variable,
            a product of a third function of the input and the input, and
            a product of a fourth function of the input and the time derivative of the input, or
        the state variables are numbered,
        one of the state variables with the last number is defined as the one state variable,
        a time derivative of each of the state variables, except for one of the state variables with the first number, is equal to a sum of:
            one of the state variables with a previous number; and
            an opposite of a product of a fifth function of the one state variable and the one state variable; and
            a product of a sixth function of the one state variable and the input,
        the time derivative of one of the state variables with the first number is equal to a sum of:
            an opposite of a product of a seventh function of the one state variable and the one state variable; and
            a product of an eighth function of the one state variable and the input, and
        the output is equal to a sum of:
            the one state variable and
            a product of a constant number and the input.

2. The non-linear characteristic calculating method according to claim 1, wherein
    the linear state space representation is a controllable canonical state space representation or an observable canonical state space representation.

3. A non-linear characteristic calculating method to be executed by a computer, for calculating a non-linear characteristic of a non-linear device,
the computer including a processor and an external interface, and
the method comprising:
calculating, by the processor, the non-linear characteristic of the non-linear device based on a non-linear model comprising a plurality of sets of non-linear equations obtained by replacing constant coefficients of a linear state space representation having one or two state variables that are also coefficients of a transfer function with functions of one state variable, and an equation whose output is a sum of outputs of the plurality of sets of non-linear equations, and
outputting, via the external interface, a result of the non-linear characteristic,
wherein the one state variable indicates an internal state of the non-linear device,
wherein, when the non-linear equations are described in the state space representation which includes a matrix, a vector composed of the state variables, an input, and an output, the vector indicates an internal state of the non-linear device and is distinct from the input, and the one state variable is a component of the vector,
wherein the calculating the non-linear characteristic calculates linear responses at bias points and transient responses of the non-linear device,
the non-linear model includes a plurality of subsets of non-linear equations, each subset of the non-linear equations corresponds to each of a plurality of sets of non-linear state space representations,
the one state variable is one of the state variables of each of the plurality of sets of non-linear state space representations, and
the non-linear device is an electrical component, and
wherein the method further comprises making, by the processor, the non-linear model with the functions fit linear responses at the bias points, by measuring impedance values at the bias points and providing the measured impedance values for use in modeling at the bias points, and identifying the functions relevant to the non-linear equations concerning the one state variable,
wherein the non-linear equations are described by the non-linear state space representations, in which:
the state variables are numbered,
one of the state variables with the first number is defined as the one state variable,
a time derivative of each of the state variables, except for one of the state variables with the last number, is equal to one of the state variables with a next number,
the time derivative of one of the state variables with the last number is equal to a sum of the input and a linear combination, the linear combination being calculated as inner product of a row vector and a column vector, respective elements of the row vector being first functions of the one state variable taken with a negative sign, and respective elements of the column vector being all of the state variables, and
the output is equal to a sum of:
a linear combination, the linear combination being calculated as inner product of another row vector and the column vector, respective elements of the another row vector being second functions of the one state variable,
a product of a third function of the input and the input, and
a product of a fourth function of the input and the time derivative of the input, or
the state variables are numbered,
one of the state variables with the last number is defined as the one state variable,
a time derivative of each of the state variables, except for one of the state variables with the first number, is equal to a sum of:
one of the state variables with a previous number; and
an opposite of a product of a fifth function of the one state variable and the one state variable; and
a product of a sixth function of the one state variable and the input,
the time derivative of one of the state variables with the first number is equal to a sum of:
an opposite of a product of a seventh function of the one state variable and the one state variable; and
a product of an eighth function of the one state variable and the input, and
the output is equal to a sum of:
the one state variable and
a product of a constant number and the input.

4. The non-linear characteristic calculating method according to claim 1, wherein
the non-linear device is a non-linear device with one input and one output or a non-linear device with one or more inputs and one or more outputs.

5. The non-linear characteristic calculating method according to claim 1, wherein
the non-linear device is an electrical component, a mechanical component, or an electromechanical component.

6. The non-linear characteristic calculating method according to claim 1, wherein
the non-linear device is a non-linear device having a non-linearity that appears as a change in a transfer function at each of one or more equilibrium points.

7. The non-linear characteristic calculating method according to claim 1, wherein
the non-linear characteristic is a non-linear characteristic that appears as a change in a transfer function at each equilibrium point and is a non-linear characteristic caused by a non-linearity that appears as a change in a transfer function at each of one or more equilibrium points.

8. A non-transitory computer readable recording medium having stored thereon a non-linear characteristic calculating program that enables a computer to execute a non-linear characteristic calculating method for calculating a non-linear characteristic of a non-linear device,
the computer including a processor and an external interface, and
the method comprising:
calculating, by the processor, the non-linear characteristic of the non-linear device based on a non-linear model comprising non-linear equations obtained by replacing constant coefficients of a linear state space representation that are also coefficients of a transfer function with functions of one state variable, and
outputting, via the external interface, a result of the non-linear characteristic,
wherein the one state variable indicates an internal state of the non-linear device,
wherein, when the non-linear equations are described in the state space representation which includes a matrix, a vector composed of state variables, an input, and an output, the vector indicates an internal state of the non-linear device and is distinct from the input, and the one state variable is a component of the vector, wherein the calculating the non-linear characteristic calculates linear responses at bias points and transient responses of the non-linear device, the one state variable is one of the state variables of non-linear state space representations as the non-linear model, and the non-linear device is an electrical component, wherein the method further comprises making, by the processor, the non-linear model with the functions fit linear responses at the bias points, by measuring impedance values at the bias points and providing the measured impedance values for use in modeling at the bias points, and identifying the functions relevant to the non-linear equations concerning the one state variable, wherein the non-linear equations are described by the non-linear state space representations, in which:

the state variables are numbered, one of the state variables with the first number is defined as the one state variable, a time derivative of each of the state variables, except for one of the state variables with the last number, is equal to one of the state variables with a next number, the time derivative of one of the state variables with the last number is equal to a sum of the input and a linear combination, the linear combination being calculated as inner product of a row vector and a column vector, respective elements of the row vector being first functions of the one state variable taken with a negative sign, and respective elements of the column vector being all of the state variables, and the output is equal to a sum of:
 a linear combination, the linear combination being calculated as inner product of another row vector and the column vector, respective elements of the another row vector being second functions of the one state variable,
 a product of a third function of the input and the input, and
 a product of a fourth function of the input and the time derivative of the input, or the state variables are numbered, one of the state variables with the last number is defined as the one state variable, a time derivative of each of the state variables, except for one of the state variables with the first number, is equal to a sum of:
 one of the state variables with a previous number; and
 an opposite of a product of a fifth function of the one state variable and the one state variable; and
 a product of a sixth function of the one state variable and the input, the time derivative of one of the state variables with the first number is equal to a sum of:
 an opposite of a product of a seventh function of the one state variable and the one state variable; and
 a product of an eighth function of the one state variable and the input, and the output is equal to a sum of:
 the one state variable and
 a product of a constant number and the input.

9. The non-transitory computer readable recording medium having stored thereon the non-linear characteristic calculating program according to claim 8, wherein the program enables the computer to perform:

inputting or selecting a part number of the non-linear device;

inputting or selecting a circuit in which the non-linear device is used;

inputting operation conditions including a current supplied to the non-linear device or an applied voltage; and reading functions and constant data of the non-linear model of the selected non-linear device necessary to perform the non-linear characteristic calculating method from a database, calculating a non-linear operating characteristic on the basis of the conditions input or selected in the inputting operating conditions, and displaying calculation results.

10. A non-linear characteristic calculating program usage method of using the non-linear characteristic calculating program stored on the non-transitory computer readable recording medium according to claim 8, wherein the non-linear characteristic calculating program is accessed in a server that includes the non-linear characteristic calculating program via a network and the non-linear characteristic calculating program is used from a terminal connected to the network.

11. A non-linear characteristic calculating method to be executed by a computer, for calculating a non-linear characteristic of a non-linear device, the computer including a processor and an external interface, and the method comprising:

calculating, by the processor, the non-linear characteristic of the non-linear device based on a non-linear model comprising a plurality of sets of non-linear equations obtained by replacing constant coefficients of a linear state space representation having one or two state variables that are also coefficients of a transfer function with functions of one state variable, and an equation whose output is a sum of outputs of the plurality of sets of non-linear equations, and outputting, via the external interface, a result of the non-linear characteristic, wherein the one state variable indicates an internal state of the non-linear device, wherein, when the non-linear equations are described in the state space representation which includes a matrix, a vector composed of the state variables, an input, and an output, the vector indicates an internal state of the non-linear device and is distinct from the input, and the one state variable is a component of the vector, wherein the linear state space representation is a controllable canonical state space representation or an observable canonical state space representation, wherein the calculating the non-linear characteristic calculates linear responses at bias points and transient responses of the non-linear device, the non-linear model includes a plurality of subsets of non-linear equations, each subset of the non-linear equations corresponds to each of a plurality of sets of non-linear state space representations, the one state variable is one of the state variables of each of the plurality of sets of non-linear state space representations, and the non-linear device is an electrical component, and wherein the method further comprises making, by the processor, the non-linear model with the functions fit linear responses at the bias points, by measuring impedance values at the bias points and providing the measured impedance values for use in modeling at the bias points, and identifying the functions relevant to the non-linear equations concerning the one state variable,
wherein the non-linear equations are described by the non-linear state space representations, in which:
the state variables are numbered,
one of the state variables with the first number is defined as the one state variable,
a time derivative of each of the state variables, except for one of the state variables with the last number, is equal to one of the state variables with a next number,
the time derivative of one of the state variables with the last number is equal to a sum of the input and a linear combination, the linear combination being calculated as inner product of a row vector and a column vector, respective elements of the row vector being first functions of the one state variable taken with a negative sign, and respective elements of the column vector being all of the state variables, and
the output is equal to a sum of:
- a linear combination, the linear combination being calculated as inner product of another row vector and the column vector, respective elements of the another row vector being second functions of the one state variable,
- a product of a third function of the input and the input, and
- a product of a fourth function of the input and the time derivative of the input, or the state variables are numbered,
one of the state variables with the last number is defined as the one state variable,
a time derivative of each of the state variables, except for one of the state variables with the first number, is equal to a sum of:
- one of the state variables with a previous number; and
- an opposite of a product of a fifth function of the one state variable and the one state variable; and
- a product of a sixth function of the one state variable and the input, the time derivative of one of the state variables with the first number is equal to a sum of:
- an opposite of a product of a seventh function of the one state variable and the one state variable; and
- a product of an eighth function of the one state variable and the input, and the output is equal to a sum of:
- the one state variable and
- a product of a constant number and the input.

12. The non-linear characteristic calculating method according to claim 11, wherein
the non-linear device is a non-linear device with one input and one output or a non-linear device with one or more inputs and one or more outputs.

13. The non-linear characteristic calculating method according to claim 11, wherein
the non-linear device is an electrical component, a mechanical component, or an electromechanical component.

14. The non-linear characteristic calculating method according to claim 11, wherein
the non-linear device is a non-linear device having a non-linearity that appears as a change in a transfer function at each of one or more equilibrium points.

15. The non-linear characteristic calculating method according to claim 11, wherein
the non-linear characteristic is a non-linear characteristic that appears as a change in a transfer function at each equilibrium point and is a non-linear characteristic caused by a non-linearity that appears as a change in a transfer function at each of one or more equilibrium points.

16. A non-transitory computer readable recording medium comprising a non-linear characteristic calculating program that enables a computer to execute the non-linear characteristic calculating method according to claim 11.

17. A non-linear characteristic calculating program usage method of using the non-linear characteristic calculating program stored on the non-transitory computer readable recording medium according to claim 16, wherein
the non-linear characteristic calculating program is accessed in a server that includes the non-linear characteristic calculating program via a network and the non-linear characteristic calculating program is used from a terminal connected to the network.

18. A non-linear characteristic calculating program usage method of using the non-linear characteristic calculating program stored on the non-transitory computer readable recording medium according to claim 9, wherein
the non-linear characteristic calculating program is accessed in a server that includes the non-linear characteristic calculating program via a network and the non-linear characteristic calculating program is used from a terminal connected to the network.

\* \* \* \* \*